United States Patent
Rouvala et al.

(10) Patent No.: US 8,358,110 B2
(45) Date of Patent: *Jan. 22, 2013

(54) INTEGRATION OF SUPERCAPACITORS WITHIN A FLEXIBLE PRINTED CIRCUIT AND ASSOCIATED METHODS

(75) Inventors: Markku Rouvala, Helsinki (FI); Tapani von Rauner, Helsinki (FI)

(73) Assignee: Nokia Corporation, Espoo (FI)

( * ) Notice: Subject to any disclaimer, the term of this patent is extended or adjusted under 35 U.S.C. 154(b) by 305 days.

This patent is subject to a terminal disclaimer.

(21) Appl. No.: 12/846,673

(22) Filed: Jul. 29, 2010

(65) Prior Publication Data

US 2012/0025787 A1 Feb. 2, 2012

(51) Int. Cl.
*H01M 10/46* (2006.01)
(52) U.S. Cl. .................................................. 320/166
(58) Field of Classification Search .................. 320/107, 320/166, 167; 361/327, 500, 503, 518
See application file for complete search history.

(56) References Cited

U.S. PATENT DOCUMENTS

| | | | |
|---|---|---|---|
| 5,637,418 A | 6/1997 | Brown | |
| 6,773,848 B1 | 8/2004 | Nortoft | |
| 2001/0032666 A1* | 10/2001 | Jenson et al. | 136/256 |
| 2004/0185310 A1* | 9/2004 | Jenson et al. | 429/322 |
| 2007/0087230 A1* | 4/2007 | Jenson et al. | 429/162 |
| 2007/0243459 A1* | 10/2007 | Jenson et al. | 429/122 |
| 2008/0107802 A1 | 5/2008 | Kawaguchi | |

FOREIGN PATENT DOCUMENTS

| | | |
|---|---|---|
| JP | 2005183443 A | 7/2005 |
| JP | 2005150383 A | 9/2005 |

OTHER PUBLICATIONS http://techon.nikkeibp.co.jp/NEA/archive/200305/244638/.
http://techon.nikkeibp.co.jp/english/NEWS_EN/20081006/159228/.
http://www.sanmina-sci.com/solutions/pdfs/BC.pdf.
Das, R., et al. "High Capacitance, Large Area, Thin Film, Nanocompositve Based Embedded Capacitors." Endicott, New York.
Borland, W., et al. "Embedded Passive Component in Printed Wiring Boards: A Technology Review." CircuiTree, Mar. 1, 2001.
Pedder, David. "Technology and Infrastructre for Embedded Passive Components." Onboard Technology, Sep. 2005.
Felten. J. et al. "Embedded Ceramic Resistors and Capacitors in PWB: Process and Performance".
3MM: Embedded Capacitor Material.
Onishi, T. "Embedded Component Trend & Applications." Seminar On PCB&PKG Tech, Feb. 20, 2009.
Realff, M., et al. "Technical Cost Modelling for Decisions in Integrated vs Surface Mounted Passives." Georgia Tech, Atlanta, Georgia.
PCT International Search Report for PCT Application PCT/FI2011/050409, Sep. 1, 2011.
Written Opinion of the International Searching Authority for PCT Application PCT/FI2011/050409, Sep. 1, 2011.

* cited by examiner

*Primary Examiner* — Edward Tso
(74) *Attorney, Agent, or Firm* — Harrington & Smith

(57) ABSTRACT

An apparatus comprises a rigid-flex circuit board and an electrolyte, the rigid-flex circuit board comprising first and second rigid regions physically and electrically connected to one another by a flexible region, the flexible region comprising first and second sections each comprising an electrically conductive layer and a capacitive element, wherein the apparatus is configured such that a chamber is defined between the first and second sections with the respective capacitive elements contained therein and facing one another, the chamber comprising the electrolyte, and wherein the apparatus is configured to store electrical charge when a potential difference is applied between the respective capacitive elements.

19 Claims, 9 Drawing Sheets

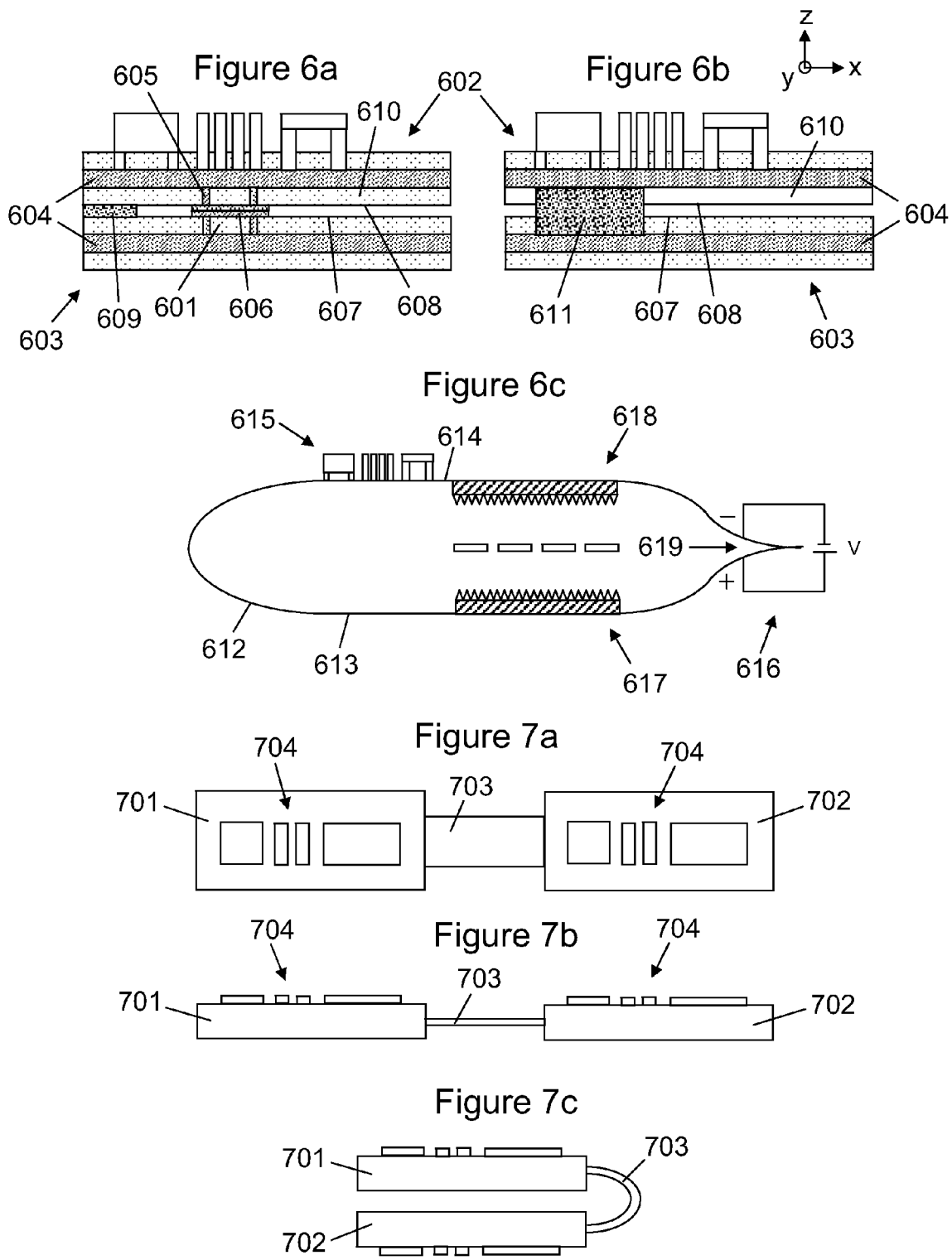

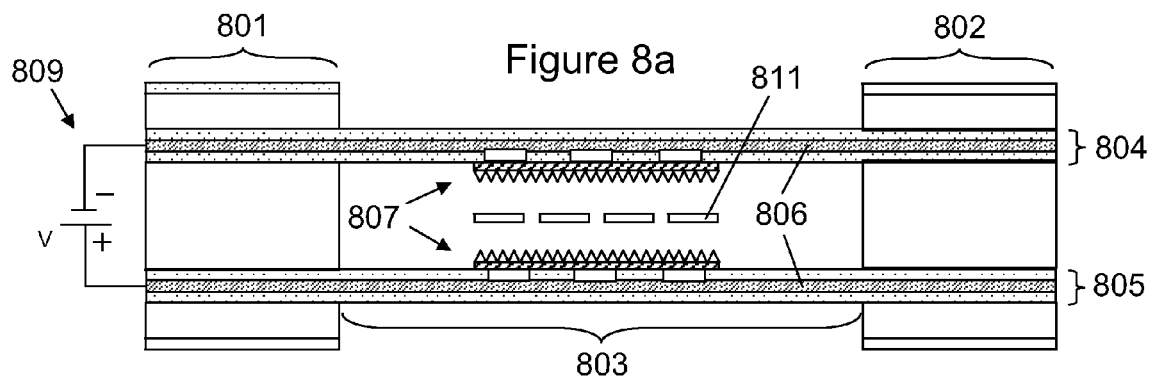
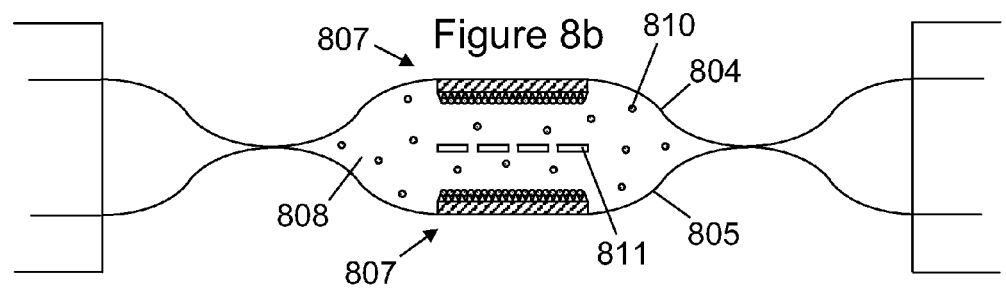
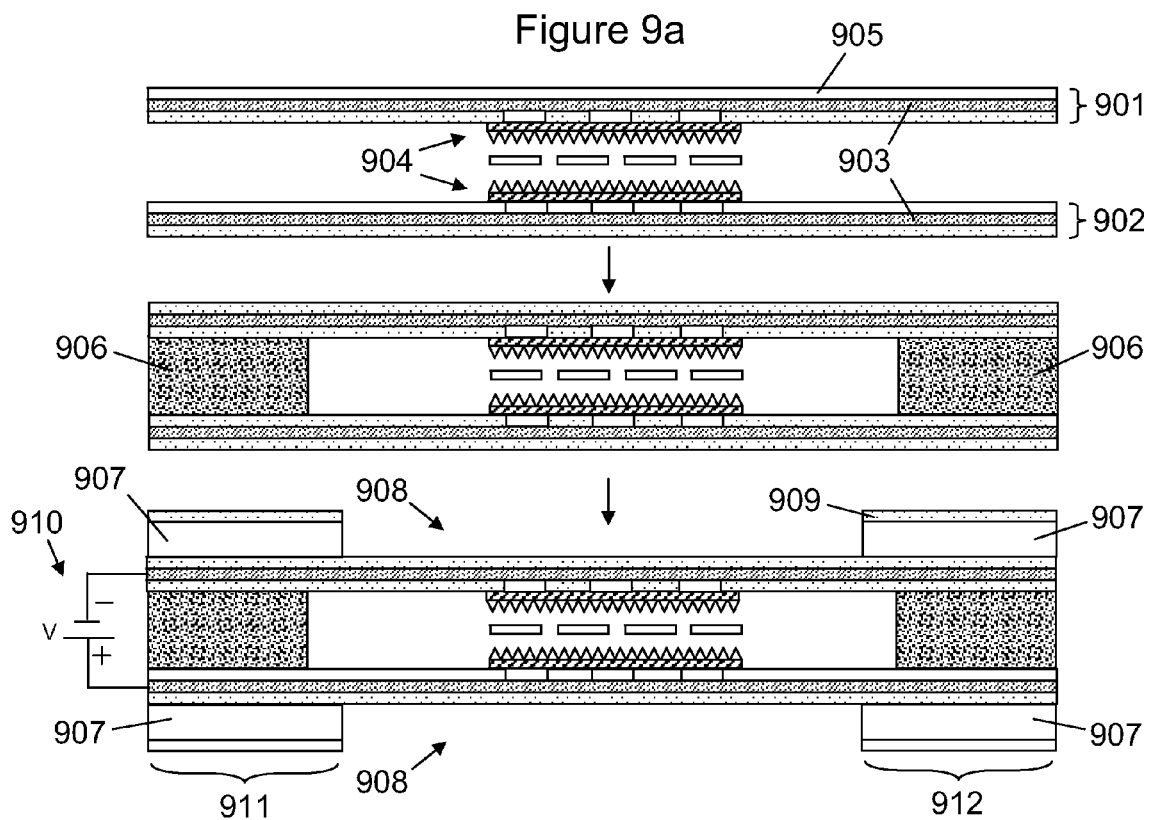

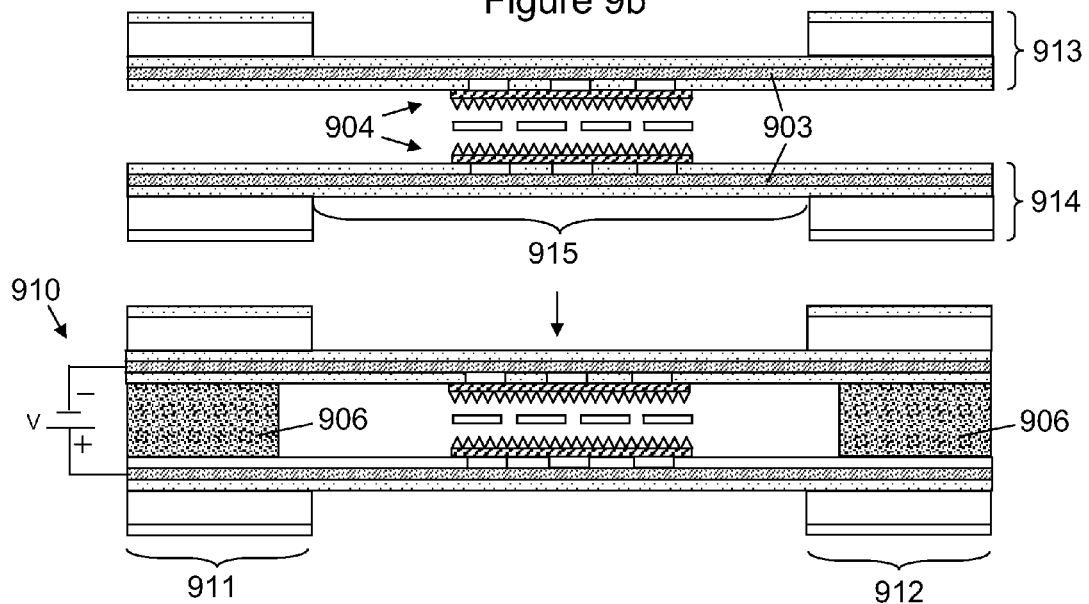
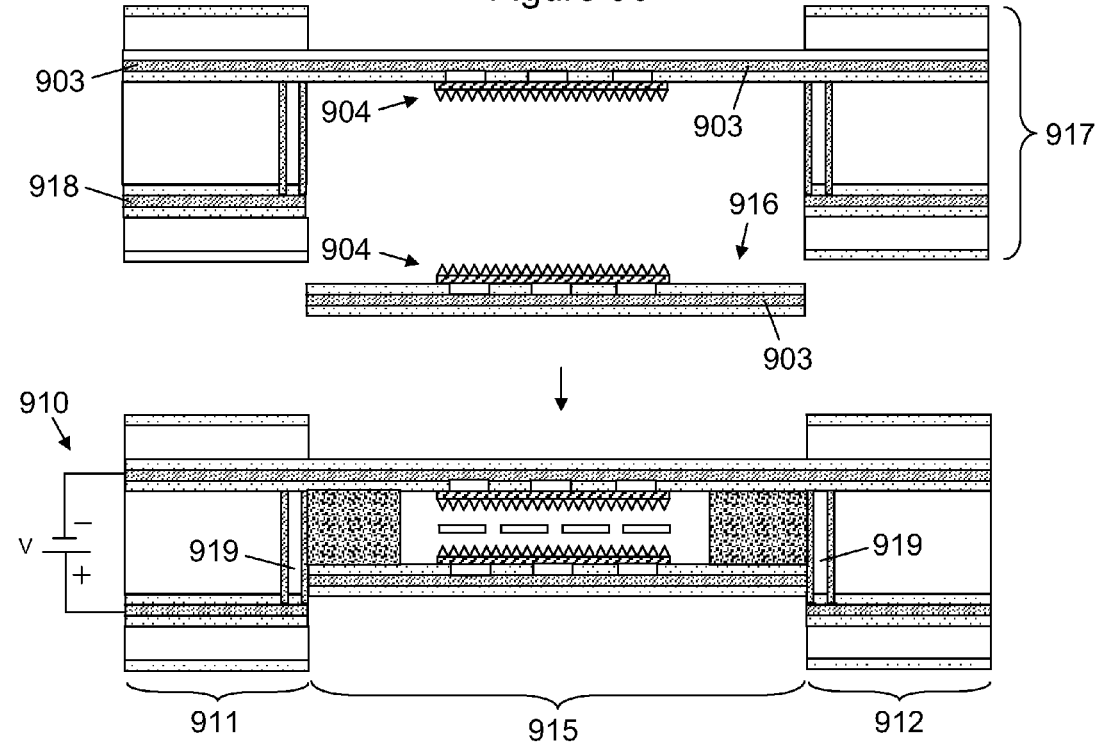

Figure 10b
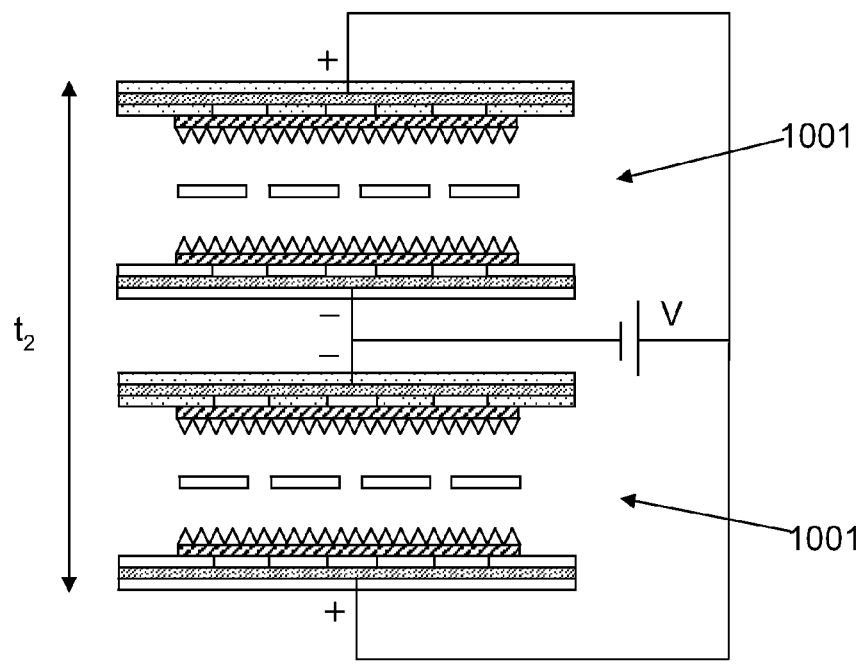
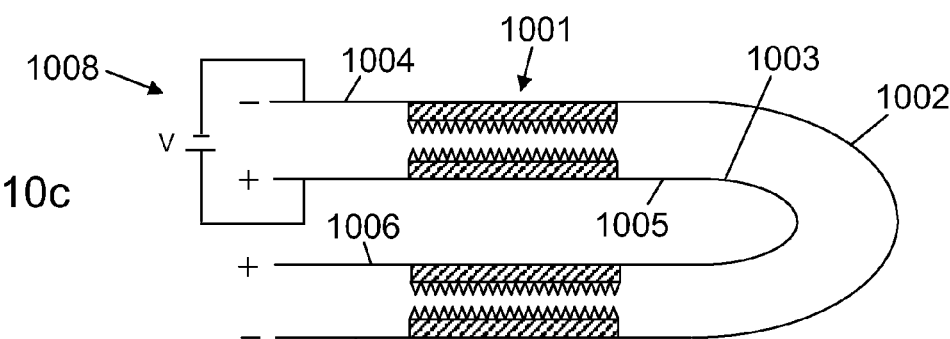
Figure 10c
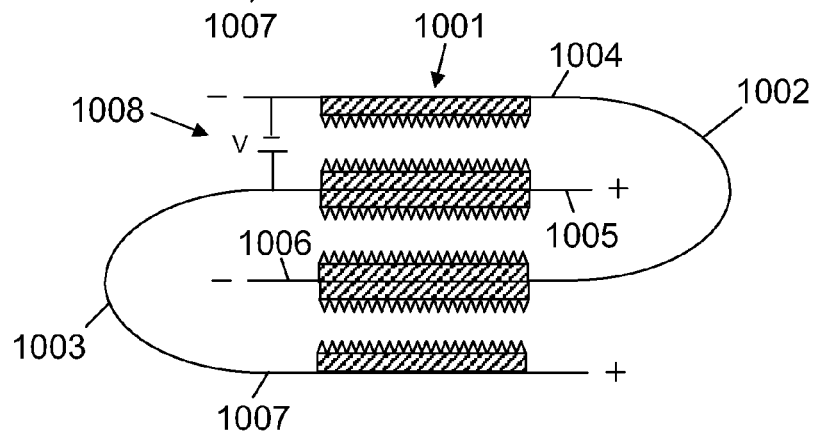
Figure 10d

INTEGRATION OF SUPERCAPACITORS WITHIN A FLEXIBLE PRINTED CIRCUIT AND ASSOCIATED METHODS

TECHNICAL FIELD

The present disclosure relates to the field of so-called "supercapacitors" and such like, associated apparatus, methods and computer programs, and in particular concerns the integration of a supercapacitor within a flexible printed circuit (FPC) structure. Certain disclosed aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed aspects/embodiments may provide one or more audio/text/video communication functions (e.g. telecommunication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Multimedia enhancement modules in portable electronic devices (such as camera flash modules, loudspeaker driver modules, and power amplifier modules for electromagnetic transmission) require short power bursts. Typically, electrolytic capacitors are used to power LED and xenon flash modules and conventional capacitors are used to power loudspeaker driver modules, but neither are able to satisfy the power demands needed for optimal performance.

The situation could be improved by the use of supercapacitors. In an LED flash module, for example, double the light output can be achieved using supercapacitors instead of electrolytic capacitors. The problem is not as straight forward as simply switching one type of capacitor for the other, however. In modern electronic devices, miniaturisation is an important factor, and state-of-the-art supercapacitors do not fulfil the size and performance requirements in currently available packaging. Power sources for modules requiring high power bursts have to be implemented close to the load circuit, which for flash and speaker applications means closer than 10-30 mm. Unfortunately, present supercapacitors can be bulky, can suffer from electrolyte swelling, and can have the wrong form factor for attachment to the circuit boards of portable electronic devices. In addition, the attachment of supercapacitors often requires several undesirable processing steps.

The apparatus and associated methods disclosed herein may or may not address one or more of these issues.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided an apparatus comprising a rigid-flex circuit board and an electrolyte, the rigid-flex circuit board comprising first and second rigid regions physically and electrically connected to one another by a flexible region, the flexible region comprising first and second sections each comprising an electrically conductive layer and a capacitive element, wherein the apparatus is configured such that a chamber is defined between the first and second sections with the respective capacitive elements contained therein and facing one another, the chamber comprising the electrolyte, and wherein the apparatus is configured to store electrical charge when a potential difference is applied between the respective capacitive elements.

In some embodiments, the flexible region of the rigid-flex circuit board may comprise more than two sections, each comprising an electrically conductive layer (i.e. multilayer stack). In these embodiments, capacitive elements may be provided between any adjacent sections within the stack. In such embodiments, the adjacent sections may be configured to define a chamber therebetween.

Each of the rigid regions may comprise a layered structure. In one embodiment, the first and second sections may form part of the layered structure of the rigid regions. In another embodiment, the first section may form part of the layered structure of the rigid regions but the second section may not. In the latter embodiment, the second section may be physically attached to the first section with an adhesive material (conductive or non-conductive). The adhesive material may be further configured to seal the first and second sections together to contain the electrolyte within the chamber. In a further embodiment, the flexible region may comprise a single section. The single section may comprise an electrically conductive layer and first and second capacitive elements. The first and second sections may be different ends of the single section which has been bent around onto itself to define the chamber.

Each of the first and second sections may comprise a layer of electrically conductive material coated on either side by a layer of electrically insulating material. On the other hand, each of the first and second sections may comprise a layer of electrically conductive material coated on one side by a layer of electrically insulating material. Furthermore, each of the first and second sections may comprise multiple layers of electrically conductive material separated by layers of electrically insulating material. Each layer of electrically conductive material may be electrically connected to one or more of the other layers of electrically conductive material by a vertical interconnect access (VIA) connection or an electrically conductive adhesive.

The capacitive elements may be referred to as "electrodes". Each capacitive element may comprise a high surface area material. Each capacitive element may comprise an electrically conductive region having a surface. The electrically conductive region may comprise one or more of the following materials: copper, aluminium, and carbon. The high surface area material may be disposed on the surface of each electrically conductive region. In each of the embodiments described herein, the respective surfaces/high surface area materials of the electrically conductive regions may be configured to face one another.

The high surface area material may be electrically conductive. The high surface area material may comprise one or more of the following: nanoparticles, nanowires, nanotubes, nanohorns, nanofibers and nano-onions. In particular, the high surface area material may comprise one or more of the following: activated carbon, carbon nanowires, carbon nanotubes, carbon nanohorns, carbon nanofibres and carbon nano-onions. The carbon nanotubes may be multiple wall carbon nanotubes.

The electrically conductive regions may be configured to maximise adhesion of the high surface area material to the surfaces of the electrically conductive regions. The electrically conductive regions may be configured to minimise the electrical resistance of the capacitive elements. The thickness of the high surface area material may be configured to minimise the electrical resistance of the capacitive elements.

The layer(s) of electrically conductive material may be electrically connected to the electrically conductive region by one or more of the following: a connector, a vertical interconnect access (VIA) connection, a pogo pin, a solder contact, a wire, and an electrically conductive adhesive (such as an anisotropic conductive adhesive, a pressure setting adhesive or a temperature setting adhesive). The layer(s) of electrically conductive material may comprise copper. The layer(s) of electrically insulating material may comprise polyimide. The layer(s) of electrically insulating material may be adhered to the layer(s) of electrically conductive material by an adhesive.

One or more of the first rigid region, the second rigid region and the flexible region may or may not comprise one or more of the following: a cover layer, an electromagnetic shield layer, a thermal protection layer, and an organic surface protection layer. Each of the first and second sections of the flexible region may comprise a layer of surface protection material between the electrically conductive region and the high surface area material. The layer of surface protection material may comprise an organic surface protection (OSP) material.

The apparatus may comprise a power supply configured to apply the potential difference between the capacitive elements. The power supply may comprise first and second terminals of opposite polarity. The electrically conductive layers of the first and second sections may be electrically connected to the first and second terminals of the power supply, respectively.

The apparatus may comprise an electrical connector between the electrically conductive layers of the first and second sections. The electrical connector may be configured to enable a flow of electrical charge from the capacitive elements to provide power to one or more electrical components when the apparatus discharges. The one or more electrical components may be physically and electrically connected to one or both of the first and second sections. The electrical connector may comprise an electrically conductive adhesive. The electrically conductive adhesive may comprise one or more of the following: an anisotropic conductive adhesive, a conductive pressure setting adhesive and a conductive temperature setting adhesive. The electrically conductive adhesive may be further configured to seal the first and second sections together to contain the electrolyte within the chamber. The electrical connector may comprise a metallic interconnector. The metallic interconnector may be a vertical interconnect access (VIA) connector. The apparatus may comprise a switch configured to connect and disconnect the electrical connector/connection. Disconnection of the electrical connector may be configured to allow the apparatus to be charged. Connection of the electrical connector may be configured to allow the apparatus to be discharged. The switch may be located in the rigid or flexible regions of the rigid-flex circuit board, or within a charger circuit forming part of the rigid-flex circuit board assembly.

The apparatus may comprise a ring between the first and second sections. The ring may be configured to surround the capacitive elements to form the chamber. The ring may be sealingly attached to the first and second sections to contain the electrolyte within the chamber. The ring may also be formed from an adhesive material (electrically conducting or non-conducting). An anisotropic conductive adhesive or a conductive pressure setting adhesive may be used to form the ring. This has the advantage that the same process used to form the electrical connection between the first and second sections may also be used to define the chamber, thereby simplifying fabrication of the apparatus.

The flexible region may be configured to allow the apparatus to be bent about the flexible region. The flexible region may be configured to allow the apparatus to be bent through an angle of less than or equal to 180°. The flexible region may be sufficiently flexible to render the apparatus suitable for use in flex-to-install applications. The supercapacitor chamber may be configured to increase the rigidity of the flexible region. For example, the flexible region may be configured to allow the rigid-flex structure to bend about the flexible region with a minimum bending radius of 0.5 mm before integration of the supercapacitor, and a minimum bending radius of 0.2-0.5 cm after integration of the supercapacitor. In contrast, the rigid regions may be configured to resist bending, but may be flexible to some extend if the rigid regions are sufficiently thin, e.g. through an angle of less than or equal to 5°, say.

The apparatus may be configured to store electrical charge at the interface between the capacitive elements and the electrolyte. The electrolyte may be located between the capacitive elements. The electrolyte may comprise first and second ionic species of opposite polarity. The first and second ionic species may be configured to move towards the capacitive element of the first and second sections, respectively, when a potential difference is applied between the capacitive elements. The electrolyte may be an organic electrolyte. The organic electrolyte may be based on an aprotic solvent such as acetonitrile, or on a carbonate-based solvent such as propylene carbonate. The electrolyte may comprise tetraethylammonium tetrafluoroborate in acetonitrile. The electrolyte may be an aqueous electrolyte. The electrolyte may be chosen such that a potential difference of between 0V and 0.9V may be applied between the capacitive elements without the electrolyte breaking down. Advantageously, the electrolyte may be chosen such that a potential difference of between 0V and 2.7V may be applied between the capacitive elements without the electrolyte breaking down.

The apparatus may comprise a separator between the capacitive elements. The separator may be configured to prevent direct physical contact between the capacitive elements. The separator may comprise one or more pores. The pores in the separator may be configured to allow the first and second ionic species to pass through the separator towards the capacitive elements when the potential difference is applied, thereby facilitating charging of the apparatus. Likewise, the pores in the separator may be configured to allow the first and second ionic species to pass through the separator away from the capacitive elements when the apparatus is used to power an electrical component, thereby facilitating discharging of the apparatus. The separator may comprise one or more of the following: polypropylene, polyethylene, cellulose, and polytetrafluoroethylene. The separator may comprise one, two, three, or more than three layers. Each layer may comprise one or more of the above-mentioned materials.

According to a further aspect, there is provided a module for a portable electronic device, the module comprising any apparatus described herein. The apparatus may form part of a multimedia enhancement module. The multimedia enhancement module may be one or more of the following: a camera flash module, a loudspeaker driver module, and a power amplifier module for electromagnetic transmission. The camera flash module may be an LED camera flash module or a xenon camera flash module. The LED camera flash module may comprise one or more of the following electrical components: an LED driver, a capacitor charger, and an LED. The loudspeaker driver module may be a stereo audio loudspeaker driver module. The power amplifier module may be a power amplifier module for RF transmission. The apparatus may be used as a power source for a digital display (such as an LED or LCD screen), or as a power source for a storage medium (such as a hard disk drive, random access memory or flash memory).

According to a further aspect, there is provided a portable electronic device comprising any apparatus described herein. The apparatus may be a portable electronic device, circuitry for a portable electronic device or a module for a portable electronic device. The apparatus may form part of a portable electronic device or part of a module for a portable electronic device. The portable electronic device may be a portable telecommunications device.

According to a further aspect, there is provided a method of assembly, the method comprising:
  forming a rigid-flex circuit board, the rigid-flex circuit board comprising first and second rigid regions physically and electrically connected to one another by a flexible region, the flexible region comprising first and second sections each comprising an electrically conductive layer and a capacitive element, the first and second sections configured to define a chamber between the first and second sections with the respective capacitive elements contained therein and facing one another; and
  providing an electrolyte within the chamber to produce an apparatus, the apparatus comprising the rigid-flex circuit board and the electrolyte,
  wherein the apparatus is configured to store electrical charge when a potential difference is applied between the respective capacitive elements.

According to a first embodiment, the method of forming the rigid-flex circuit board may comprise: providing first and second flexible sections, the first and second flexible sections each comprising an electrically conductive layer and a capacitive element; applying an adhesive to a surface of the first and/or second flexible sections; aligning the first flexible section with the second flexible section to form a stack, the first and second flexible sections aligned such that the capacitive elements are facing one another; applying pressure and/or heat to bond the first flexible section to the second flexible section using the adhesive; and depositing a rigid material on a surface of the stack leaving a region of the surface free from rigid material to maintain flexibility of the stack at this region.

According to another embodiment, the method of forming the rigid-flex circuit board may comprise: providing first and second circuit boards, the first circuit board comprising first and second rigid regions physically and electrically connected to one another by a flexible region, the second circuit board comprising a flexible region, the flexible region of each circuit board comprising an electrically conductive layer and a capacitive element; applying an adhesive to a surface of the first and/or second circuit board; aligning the first circuit board with the second circuit board to form a stack, the first and second circuit boards aligned such that the capacitive elements are facing one another; and applying pressure and/or heat to bond the first circuit board to the second circuit board using the adhesive.

According to another embodiment, the method of forming the rigid-flex circuit board may comprise: providing a rigid-flex circuit board, the rigid-flex circuit board comprising first and second rigid regions physically and electrically connected to one another by a flexible region, the flexible region comprising an electrically conductive layer and a capacitive element; providing a flexible section, the flexible section comprising an electrically conductive layer and a capacitive element; applying an adhesive to a surface of the flexible region and/or flexible section; aligning the flexible section with the flexible region to form a stack, the flexible section and the flexible region aligned such that the capacitive elements are facing one another; and applying pressure and/or heat to bond the flexible section to the flexible region using the adhesive.

According to another embodiment, the method of forming the rigid-flex circuit board may comprises: providing a rigid-flex circuit board, the rigid-flex circuit board comprising first and second rigid regions physically and electrically connected to one another by a flexible region, the flexible region comprising an electrically conductive layer and first and second capacitive elements; applying an adhesive to a surface of the flexible region; bending the rigid-flex circuit board about the flexible region such that the flexible region is bent around onto itself to form a stack, the different ends of the flexible region constituting the first and second sections; aligning the ends of the flexible region such that the first and second capacitive elements are facing one another; and applying pressure and/or heat to bond the ends of the flexible region together using the adhesive.

According to a further aspect, there is provided a method of storing electrical charge, the method comprising:
  providing an apparatus, the apparatus comprising a rigid-flex circuit board and an electrolyte,
  the rigid-flex circuit board comprising first and second rigid regions physically and electrically connected to one another by a flexible region, the flexible region comprising first and second sections each comprising an electrically conductive layer and a capacitive element,
  wherein the apparatus is configured such that a chamber is defined between the first and second sections with the respective capacitive elements contained therein and facing one another, the chamber comprising the electrolyte, and
  wherein the apparatus is configured to store electrical charge when a potential difference is applied between the respective capacitive elements; and
  applying a potential difference between the respective capacitive elements.

According to a further aspect, there is provided a computer program, the computer program comprising computer code configured to control the storage of electrical charge using an apparatus, the apparatus comprising a rigid-flex circuit board and an electrolyte,
  the rigid-flex circuit board comprising first and second rigid regions physically and electrically connected to one another by a flexible region, the flexible region comprising first and second sections each comprising an electrically conductive layer and a capacitive element,
  wherein the apparatus is configured such that a chamber is defined between the first and second sections with the respective capacitive elements contained therein and facing one another, the chamber comprising the electrolyte, and
  wherein the apparatus is configured to store electrical charge when a potential difference is applied between the respective capacitive elements, the computer program comprising computer code configured to apply a potential difference between the respective capacitive elements.

The apparatus may comprise a processor configured to process the code of the computer program. The processor may be a microprocessor, including an Application Specific Integrated Circuit (ASIC).

The present disclosure includes one or more corresponding aspects, embodiments or features in isolation or in various combinations whether or not specifically stated (including claimed) in that combination or in isolation. Corresponding means for performing one or more of the discussed functions are also within the present disclosure.

Corresponding computer programs for implementing one or more of the methods disclosed are also within the present disclosure and encompassed by one or more of the described embodiments.

The above summary is intended to be merely exemplary and non-limiting.

BRIEF DESCRIPTION OF THE FIGURES

A description is now given, by way of example only, with reference to the accompanying drawings, in which:—

FIG. 6a illustrates schematically an electrical connector comprising a metallic interconnector;

FIG. 6b illustrates schematically an electrical connector comprising an electrically conductive adhesive;

FIG. 6c illustrates schematically a flexible printed circuit structure in origami flex form;

FIG. 7a illustrates schematically an unbent rigid-flex circuit board in plan view;

FIG. 7b illustrates schematically an unbent rigid-flex circuit board in side view;

FIG. 7c illustrates schematically a bent rigid-flex circuit board in side view;

FIG. 8a illustrates schematically (in cross-section) a supercapacitor integrated within a rigid-flex circuit board;

FIG. 8b illustrates schematically the rigid-flex circuit structure of FIG. 8a in operation;

FIG. 9a illustrates schematically a first method of assembling the rigid-flex integrated supercapacitor of FIG. 8;

FIG. 9b illustrates schematically a second method of assembling the rigid-flex integrated supercapacitor of FIG. 8;

FIG. 9c illustrates schematically a third method of assembling the rigid-flex integrated supercapacitor of FIG. 8;

FIG. 10b illustrates schematically two flexible printed circuit structures connected in parallel;

FIG. 10c illustrates schematically a first configuration in which two circuit boards are combined in origami flex form to create a stack of integrated supercapacitors;

FIG. 10d illustrates schematically a second configuration in which two circuit boards are combined in origami flex form to create a stack of integrated supercapacitors;

DESCRIPTION OF SPECIFIC
ASPECTS/EMBODIMENTS

In electrical circuits, batteries and capacitors are used to provide other components with electrical power. These power supplies operate in completely different ways, however. Batteries use electrochemical reactions to generate electricity. They comprise two electrical terminals (electrodes) separated by an electrolyte. At the negative electrode (the anode), an oxidation reaction takes place which produces electrons. These electrons then flow around an external circuit from the anode to the positive electrode (the cathode) causing a reduction reaction to take place at the cathode. The oxidation and reduction reactions may continue until the reactants are completely converted. Importantly though, unless electrons are able to flow from the anode to the cathode via the external circuit, the electrochemical reactions cannot take place. This allows batteries to store electricity for long periods of time.

Figure 1A:
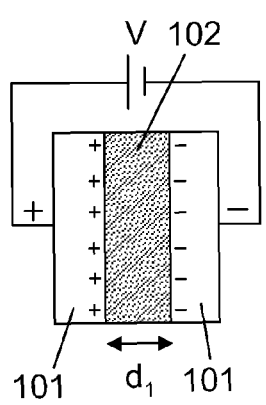
FIG. 1a illustrates schematically a conventional capacitor.

In contrast, capacitors store charge electrostatically, and are not capable of generating electricity. A conventional capacitor (FIG. 1a) comprises a pair of electrical plates 101 separated by an electrical insulator 102. When a potential difference is applied between the plates 101, positive and negative electrical charges build up on opposite plates. This produces an electric field across the insulator 102 which stores electrical energy. The amount of energy stored is proportional to the charge on the plates, and inversely proportional to the separation of the plates, $d_1$. Therefore, the energy storage of a conventional capacitor can be increased by increasing the size of the plates 101 or by reducing the thickness of the insulator 102. Device miniaturisation governs the maximum plate size, whilst material properties dictate the minimum insulator thickness that can be used without conduction of the insulator 102 (breakdown).

Figure 1B:
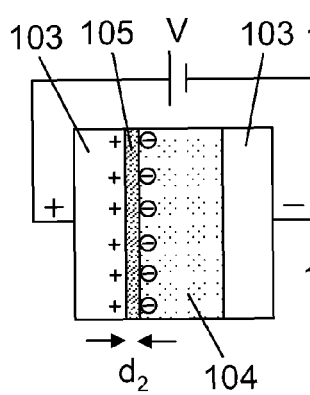
FIG. 1b illustrates schematically an electrolytic capacitor.

Electrolytic capacitors (FIG. 1b) use a special technique to minimise the plate spacing, $d_2$. They consist of two conductive plates 103 separated by a conducting electrolyte 104. When a potential difference is applied, the electrolyte 104 carries charge between the plates 103 and stimulates a chemical reaction at the surface of one of the plates. This reaction creates a layer of insulating material 105 which prevents the flow of charge. The result is a capacitor with an ultrathin dielectric layer 105 separating a conducting plate 103 from a conducting electrolyte 104. In this configuration, the electrolyte 104 effectively serves as the second plate. Since the insulating layer 105 is only a few molecules thick, electrolytic capacitors are able to store a greater amount of energy than conventional parallel plate capacitors.

Figure 1C:
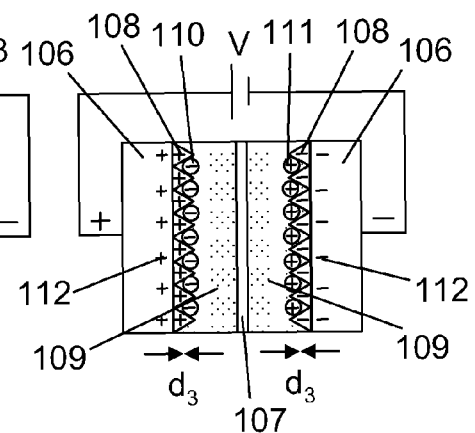
FIG. 1c illustrates schematically an embodiment of a so-called supercapacitor.

A third type of capacitor, known as a supercapacitor (FIG. 1c), allows even greater energy storage. Supercapacitors (also known as electric double layer capacitors, ultracapacitors, pseudocapacitors and electrochemical double layer capacitors) have similarities to both electrolytic and conventional capacitors. Like a conventional capacitor, a supercapacitor has two electrically conducting plates 106 that are separated by a dielectric material (a separator) 107. The plates 106 are coated in a porous material 108 such as powdered carbon to increase the surface area of the plates 106 for greater charge storage. Like an electrolytic capacitor (and also a battery), a supercapacitor contains an electrolyte 109 between the conducting plates 106. When a potential difference is applied between the plates, the electrolyte 109 becomes polarised. The potential on the positive plate attracts the negative 110 ions in the electrolyte 109, and the potential on the negative plate attracts the positive ions 111. The dielectric separator 107 is used to prevent direct physical contact (and therefore electrical contact) between the plates 106. The separator 107 is made from a porous material to allow the ions 110, 111 to flow towards the respective plates 106.

Unlike batteries, the applied potential is kept below the breakdown voltage of the electrolyte 109 to prevent electrochemical reactions from taking place at the surface of the plates 106. For this reason, a supercapacitor cannot generate electricity like an electrochemical cell. Also, without electrochemical reactions taking place, no electrons are generated. As a result, no significant current can flow between the electrolyte 109 and the plates 106. Instead, the ions 110, 111 in solution arrange themselves at the surfaces of the plates 106 to mirror the surface charge 112 and form an insulating "electric double layer". In an electric double layer (i.e. a layer of surface charge 112 and a layer of ions 110, 111), the separation, $d_3$, of the surface charges 112 and ions 110, 111 is on the order of nanometers. The combination of the electric double layer and the use of a high surface area material 108 on the surface of the plates 106 allow a huge number of charge carriers to be stored at the plate-electrolyte interface.

Activated carbon is not the most suitable material 108 for coating the plates 106 of the capacitor, however. The ions 110, 111 in solution are relatively large in comparison to the pores in the carbon, and this limits the energy storage considerably. Recent research in this area has focused on the use of carbon nanotubes and carbon nanohorns instead, both of which offer higher useable surface areas than activated carbon.

Supercapacitors have several advantages over batteries, and as a result, have been tipped to replace batteries in many applications. They function by supplying large bursts of current to power a device and then quickly recharging themselves. Their low internal resistance, or equivalent series resistance (ESR), permits them to deliver and absorb these large currents, whereas the higher internal resistance of a traditional chemical battery may cause the battery voltage to collapse. Also, whilst a battery generally demands a long recharging period, supercapacitors can recharge very quickly, usually within a matter of minutes. They also retain their ability to hold a charge much longer than batteries, even after multiple rechargings. When combined with a battery, a supercapacitor can remove the instantaneous energy demands that would normally be placed on the battery, thereby lengthening the battery lifetime.

Whereas batteries often require maintenance and can only function well within a small temperature range, supercapacitors are comparatively maintenance-free and perform well over a broad temperature range. Supercapacitors also have longer lives than batteries, and are built to last until at least the lifetime of the electronic devices they are used to power. Batteries, on the other hand, typically need to be replaced several times during the lifetime of a device.

Supercapacitors are not without their drawbacks, however. Despite being able to store a greater amount of energy than conventional and electrolytic capacitors, the energy stored by a supercapacitor per unit weight is considerably lower than that of an electrochemical battery. In addition, the working voltage of a supercapacitor is limited by the electrolyte breakdown voltage, which is not as issue with batteries.

As mentioned earlier, existing supercapacitors can be bulky, can suffer from electrolyte swelling and may not have the optimum form factor for attachment to the circuit boards of portable electronic devices. Furthermore, the attachment of existing supercapacitors to circuit boards often requires several processing steps, thereby rendering them impractical. There will now be described an apparatus and associated methods that may or may not overcome one or more of these issues.

Figure 2:
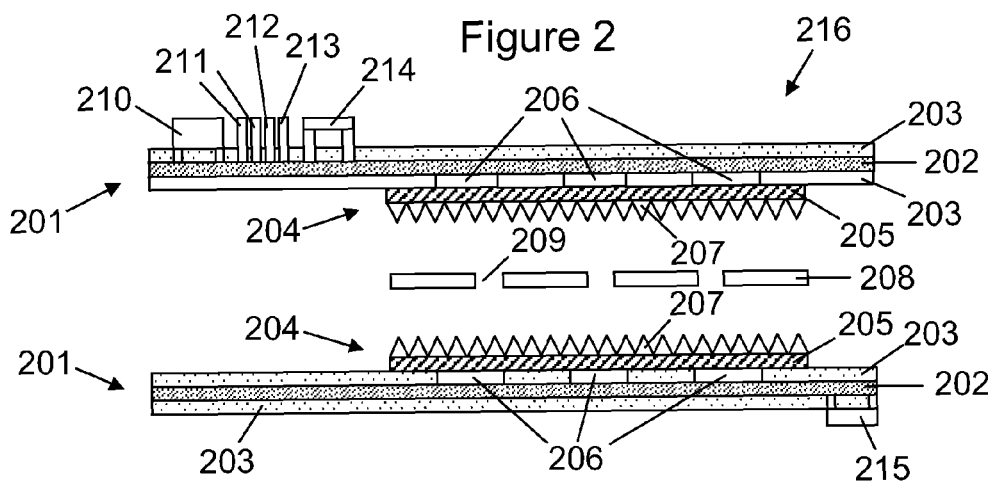
FIG. 2 illustrates schematically (in cross section) a supercapacitor integrated within a flexible printed circuit structure.

In FIG. 2, there is illustrated a supercapacitor integrated within a flexible printed circuit (FPC) structure 216. The use of an FPC structure 216 provides a "flex-to-install solution". Flex-to-install refers to a circuit which is bent or folded during device assembly, but which undergoes minimal flexing during the lifetime of the device. If the FPC structure 216 is sufficiently durable, it may also be suitable for dynamic flex applications in which the circuit board is required to bend both during and after device assembly.

The apparatus consists of two FPC boards 201, each comprising a layer of electrically conductive material 202. In this embodiment, the layer of electrically conductive material 202 on each FPC board 201 is coated on either side by a layer of electrically insulating material 203. Subtraction of the insulating material 203 is used to define conductive traces in the electrically conductive material 202. The insulating material 203 is also used to protect the electrically conductive material 202 from the external environment.

Each FPC board 201 further comprises a capacitive element 204 with an electrically conductive region 205. The electrically conductive regions 205 are electrically connected to the layers of electrically conductive material 202, e.g. by vertical interconnect access (VIA) connections 206. The capacitive elements 204 also comprise a high surface area material 207 on top of the electrically conductive regions 205, the material 207 comprising a mixture of one or more of activated carbon (AC), multiple wall carbon nanotubes (MWNTs), carbon nanohorns (CNHs), carbon nanofibers (CNFs) and carbon nano-onions (CNOs). AC, MWNTs, CNHs, CNFs and CNOs are used because of their large electrical conductivity and high surface area. As mentioned earlier, the high surface area allows adsorption of large numbers of electrolyte ions onto the surface of the capacitive elements 204.

The high surface area material 207 may be prepared by mixing different proportions of AC, MWNTs and CNHs together using polytetrafluoroethylene (PTFE) as a binder and acetone as a solvent, and homogenising the mixture by stirring. Following this, the resulting slurry is applied by rolling the mixture onto the surface of each electrically conductive region 205. The FPC boards 201 are then annealed at 50° C. for 20 minutes to drive off the solvent and consolidate the mixture. To maximise its surface area and electrical conductivity, the high surface material 207 is applied to the electrically conductive regions 205 as a thin film.

As shown in FIG. 2, the FPC boards 201 are configured such that the electrically conductive regions 205 (now coated in the high surface area material 207) are facing one another, sandwiching a thin dielectric separator 208 therebetween. The separator 208 prevents direct physical contact (and therefore electrical contact) between the capacitive elements 204, but comprises a number of pores 209 to enable the ions of the electrolyte to move towards the high surface area material 207 when a potential difference has been applied between the capacitive elements 204.

The electrically conductive regions 205 may be formed from a variety of different materials, but advantageously are made from copper, aluminium or carbon. The choice of material affects the physical and electrical properties of the supercapacitor. Copper, and to a lesser extent aluminium, exhibit favourable electrical conductivity. This is advantageous because it allows charge carriers from the electrically conductive layer 202 to flow through the electrically conductive region 205 to the high surface area material 207 with minimum resistance. On the other hand, carbon offers better adhesion to the high surface area material 207 than copper and aluminium, and is more cost effective. Carbon also provides a low resistance (ESR) path between the electrically conductive region 205 and the high surface area material 207. Using carbon, supercapacitors with an ESR of ~3Ω can be produced. Furthermore, the resistance between the electrically conductive layer 202 and the electrically conductive region 205 may be reduced by increasing the number or size of the electrical connections (VIAs) 206. The resistance may also be reduced by removing insulating material 203 adjacent the electrically conductive region 205 such that electrically conductive region 205 can be deposited directly onto the electrically conductive layer 202. The electrically conductive regions 205 may also comprise a surface finish (coating) to protect the electrically conductive regions 205 or to modify their structural or material properties. Possible surface materials include nickel-gold, gold, silver, or an organic surface protection (OSP) material.

As mentioned in the background section, supercapacitors may be used to power multimedia enhancement modules in portable electronic devices. For modules that require high power bursts, such as LED flash modules, the supercapacitor needs to be implemented close to the load circuit. In the present case, the FPC structure 216 (within which the supercapacitor is integrated) forms the multimedia enhancement module, with the various components of the module physically (and electrically) connected to the FPC boards 201. In FIG. 2, a surface mounted (SMD) LED 210, two ceramic caps 211, an indicator LED 212, an inductor 213, and a supercapacitor charger and LED driver circuit 214 are (electrically) connected to the electrically conductive layer 202 of the upper FPC board 201, whilst a board-to-board (B2B) connector 215 is (electrically) connected to the electrically conductive layer 202 of the lower FPC board 201. The various electrical components may be soldered or ACF (anisotropic conductive film) contacted to the FPC boards 201. The electrically conductive layers 202 are used to route power to and from the supercapacitor and module components, and the B2B connector 215 (electrically) connects the FPC structure 216 to the main board of the electronic device.

An electrolyte is required between the capacitive elements 204 to enable the storage of electrical charge. To achieve this, the FPC boards 201 are configured to form a chamber within which the electrolyte can be contained. The chamber is illustrated in cross-section in FIG. 3a, and in plan view in FIG. 3b. To create the chamber 301, a border 302 around the capacitive elements 303 is defined (shown in plan view). The FPC boards 304 are then sealed together at the border 302 to prevent the electrolyte 305 (which may be a gel or liquid-type electrolyte) from leaking out or evaporating during use. The FPC boards 304 may be sealed by heat lamination, vacuum packing or standard FPC punching processes. A small region (not shown) of the border 302 may remain unsealed until the electrolyte 305 has been introduced into the chamber 301.

In another embodiment, a ring may be incorporated into the FPC structure to form a chamber. In this embodiment (not shown), the ring is positioned around the capacitive elements 303 and sandwiched between the FPC boards 304. In practise, this may involve placing a first FPC board face-up on a flat surface; placing the ring (which has a diameter of at least the largest in-plane dimension of the capacitive elements 303) around the capacitive element of this FPC board; sealingly attaching the ring to the FPC board; filling the ring with electrolyte 305; placing a second FPC board face-down on top of the first FPC board such that the capacitive element of the second FPC board is contained within the ring and facing the other capacitive element; and sealingly attaching the second FPC board to the ring. Ideally, the thickness of the ring should be substantially the same as the total thickness of the FPC structure. Nevertheless, due to the flexibility of the FPC boards 304, the ring thickness may deviate from the total thickness of the FPC structure and still allow formation of the chamber.

In another embodiment, the ring may comprise an aperture. In this embodiment, the electrolyte may be introduced to the chamber via the aperture and subsequently sealed to retain the electrolyte 305.

Figure 3A:
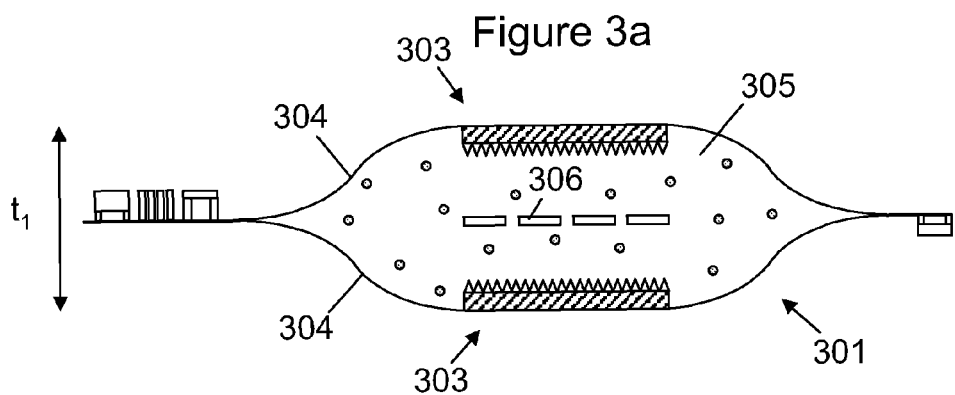
FIG. 3a illustrates schematically the flexible printed circuit structure of FIG. 2 configured to define a chamber between the first and second circuit boards.
Figure 3B:
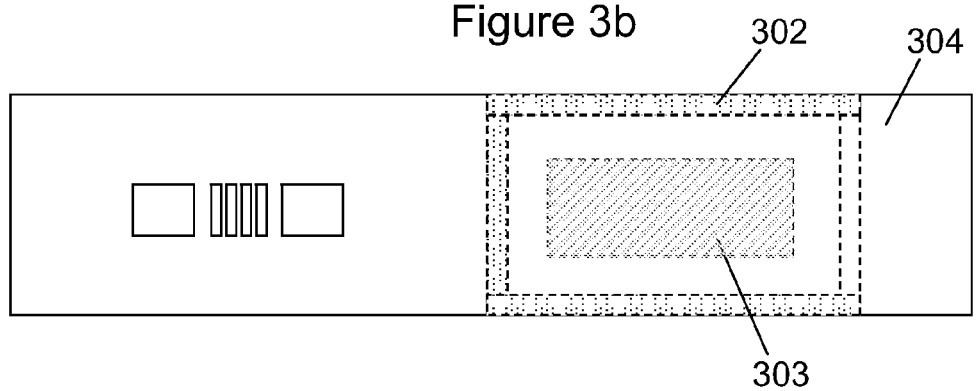
FIG. 3b illustrates schematically the flexible printed circuit structure of FIG. 3a in plan view.

It should be noted, however, that the thickness, $t_1$, of the chamber 301 is exaggerated in FIG. 3a. In practice, the capacitive elements 303 and separator 306 are in physical contact to minimise the thickness of the chamber 301. In another embodiment, the capacitive elements 303 may simply be spaced apart from one another. This configuration would remove the need for a separator 306, but may be difficult to maintain if the FPC structure is physically flexible.

Figure 4:
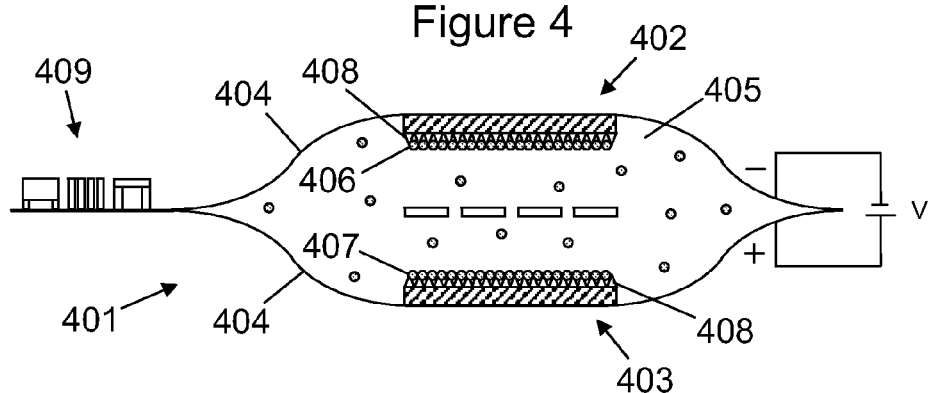
FIG. 4 illustrates schematically the flexible printed circuit structure of FIG. 3a in operation.

To charge the apparatus, a potential difference is applied across the capacitive elements 402, 403 (FIG. 4). This is performed by connecting the positive and negative terminals of a battery (or other power supply) to the electrically conductive layers of the respective FPC boards 404. In practice, however, the electrically conductive layers of the FPC boards 404 would typically be connected to a charger circuit (not shown) which itself is connected to the battery or other power supply. Application of the potential difference polarises the electrolyte 405, causing adsorption of the positive 406 and negative 407 ions onto the exposed surfaces of the high surface area material 408 of the negatively 402 and positively 403 charged capacitive elements, respectively. The charge stored at the interface between the high surface area material 408 and the electrolyte 405 can be used to power the components of the multimedia enhancement module 409 when the supercapacitor discharges.

Figure 5A:
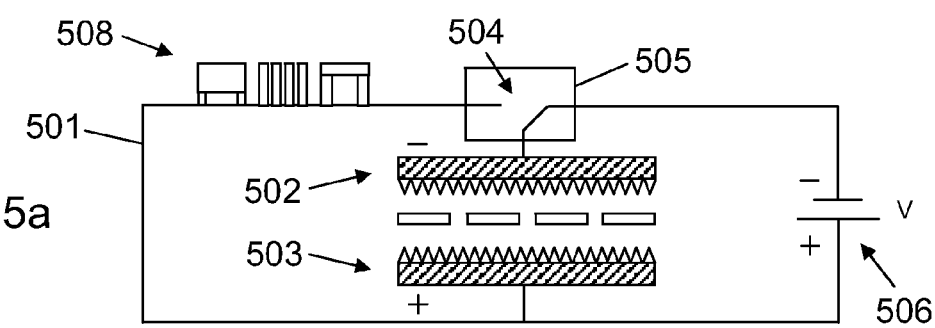
FIG. 5a illustrates schematically charging of the flexible printed circuit structure.
Figure 5B:
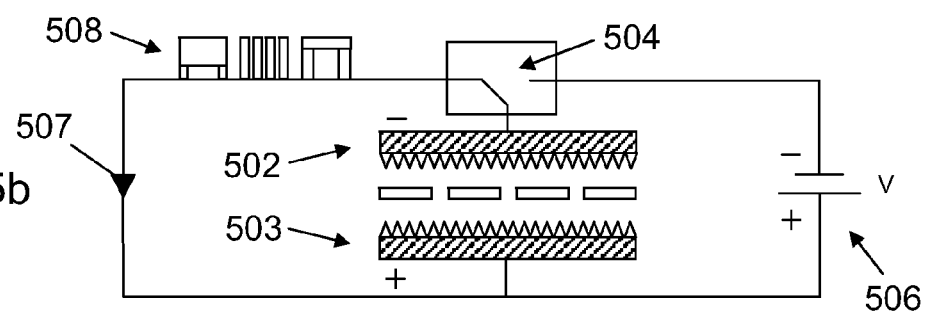
FIG. 5b illustrates schematically discharging of the flexible printed circuit structure.

A variety of different configurations may be used to discharge the apparatus. In one configuration (shown in FIG. 5), an electrical connector 501 is provided between the electrically conductive layers of the FPC boards. The electrical connector 501 allows electrons to flow from the negatively charged capacitive element 502 to the positively charged capacitive element 503. To prevent this flow of electrons when the apparatus is charging, however, the apparatus may include a switch 504 configured to connect and disconnect the electrical connector 501 (i.e. make or break the connection). Disconnection of the electrical connector 501 allows the apparatus to be charged, whilst connection of the electrical connector 501 allows the apparatus to be discharged. The switch 504 may be provided within a charger circuit 505. When the switch 504 is in a first position (FIG. 5a), it connects the apparatus to the power supply 506, allowing the capacitive elements 502, 503 to be charged. Once the capacitive elements 502, 503 have been charged, movement of the switch 504 to a second position (FIG. 5b) disconnects the apparatus from the power supply 506 and connects the capacitive elements 502, 503 to the electrical components 508. This allows electrons to flow 507 from the negatively charged capacitive element 502 to the positively charged capacitive element 503, thereby discharging the apparatus. The electrical components 508 may be electrically connected to the electrically conductive layers of one or both of the FPC boards. Once the apparatus has been discharged, movement of the switch 504 back to the first position again (FIG. 5a) causes the power supply 506 to recharge the apparatus. A person skilled in the art will appreciate that there are other ways of configuring the circuit to charge and discharge the apparatus, the configuration shown in FIG. 5 constituting just one possible implementation.

As illustrated in FIG. 6a, the electrical connector may comprise a metallic interconnector such as a vertical interconnect access (VIA) connector. To form this connector, holes 601 are made in the insulating material 610 of each FPC board 602, 603 (possibly by drilling) to reveal the electrically conductive layers 604 (from which the bus lines of the FPC boards 602, 603 are formed). The internal surface of each hole 601 is then plated with an electrically conductive coating 605 (typically a metal such as copper) using a partial plating process such that the electrically conductive material 605 is in electrical contact with the electrically conductive layer 604. Alternatively, the holes 601 may be filled with electrically conductive material, rings or rivets to form the electrical connection. Electrically conductive pads 606 are then deposited on the top surface 607 and bottom surface 608 of the bottom 603 and top 602 FPC boards, respectively, in electrical contact with the electrically conductive coating 605 of each hole 601. The pads 606 may be formed using a lithographic procedure, but could be formed using the plating/filling process by simply extending deposition of the electrically conductive coating 605 from within the holes 601 to the surfaces 607, 608 of the FPC boards 602, 603. Once the pads 606 have been formed, the FPC boards 602, 603 are positioned one on top of the other. The holes 601 of the top FPC board 602 are aligned with the holes 601 of the bottom FPC board 603 so that the pads 606 on the top surface 607 of the bottom FPC board 603 are in physical and electrical contact with the pads 606 on the bottom surface 608 of the top FPC board 602. In this way, the pads 606 and electrically conductive coating 605 of both FPC boards 602, 603 form an electrical path between the electrically conductive layers 604. In order to maintain the alignment (and therefore electrical connection), however, the FPC boards 602, 603 must be held in place. This may be achieved using an adhesive 609 between the FPC boards 602, 603 to prevent movement therebetween.

The plating process (possibly with additional lithographic steps to form the pads) described above is time consuming, labour intensive and expensive. It is also technically difficult to implement. A more efficient process for forming the electrical connector will now be described with reference to FIG. 6b.

Anisotropic conductive adhesive (ACA), encompassing both anisotropic conductive film (ACF) and anisotropic conductive paste (ACP), is a lead-free and environmentally friendly interconnect system commonly used in liquid crystal display (LCD) manufacturing to make electrical and mechanical connections from the driver electronics to the glass substrates of the LCD. It has more recently been used to form the flex-to-board or flex-to-flex connections used in handheld electronic devices such as mobile phones, MP3 players, or in the assembly of CMOS camera modules. The material consists of an adhesive polymer containing electrically conductive particles.

ACA may be applied to the surfaces of the FPC boards to form an electrical connection. To achieve this, the electrically conductive layers 604 must first be exposed. This is performed by removing some of the insulating material 610 above and below the electrically conductive layers 604 of the bottom 603 and top 602 FPC boards, respectively (possibly by drilling). Once the electrically conductive layers 604 are exposed, ACA 611 is deposited on the top surface 607 of the bottom FPC board 603 in physical contact with the exposed material of the electrically conductive layers 604. This may be done using a lamination process for ACF, or either a dispense or printing process for ACP. The top FPC board 602 is then placed in position over the bottom FPC board 603 (i.e they are aligned with one another), and the two FPC boards 602, 603 are pressed together to mount the top FPC board 602 on the bottom FPC board 603. The mounting step may be performed using no heat, or using just enough heat to cause the ACA 611 to become slightly tacky.

Using Hitachi™ chemical AC2051/AC2056 as the ACA, the temperature, pressure and time parameters required to successfully mount the top FPC board 602 on the bottom FPC board 603 are 80° C., 10 kgf/cm$^2$ and 5 secs, respectively. Using 3M™ ACF 7313 as the ACA, the temperature, pressure and time parameters are 100° C., 1-15 kgf/cm$^2$ and 1 sec, respectively.

Bonding is the final step in the process required to complete the ACA assembly. During lamination and mounting, the temperature may range from ambient to 100° C. with the heat applied for 1 second or less. In order to bond the FPC boards 602, 603 together, however, a greater amount of thermal energy is required, firstly to cause the ACA 611 to flow (which allows the FPC boards 602, 603 to be positioned for maximum electrical contact), and secondly to cure the ACA 611 (which allows a lasting and reliable bond to be created). Depending on the specific ACA and FPC materials used, the required temperature and heating time may range from 130-220° C. and 5-20 secs, respectively. The bonding step is performed by pressing a bonding tool head (not shown) onto the top FPC board 602. The tool head is maintained at the required temperature and is applied to the top FPC board 602 at the required pressure for the required period of time. The required pressure may range from 1-4 MPa (~10-40 kgf/cm$^2$) over the entire area under the tool head.

Using Hitachi™ chemical AC2051/AC2056 as the ACA, the temperature, pressure and time parameters required to successfully bond the top FPC board 602 to the bottom FPC board 603 are 170° C., 20 kgf/cm$^2$ and 20 secs, respectively. Using 3M™ ACF 7313 as the ACA, the temperature, pressure and time parameters are 140° C., 15 kgf/cm$^2$ and 8-12 secs, respectively.

When the ACA 611 is compressed, the electrically conductive particles contained within the adhesive polymer are forced into physical contact with one another, thereby creating an electrical path from the electrically conductive layer 604 of the top FPC board 602 to the electrically conductive layer 604 of the bottom FPC board 603. The electrical path is highly directional (hence anisotropic conductive adhesive). It allows current to flow in the z-axis, but prevents the flow of current in the x-y plane. This feature is important in the present apparatus, because it prevents (or minimises) electrical shorting of the electrolyte. As the ACA 611 cures, the electrically conductive particles are fixed in the compressed form, thereby maintaining good electrical conductivity in the z-axis.

Rather than having to apply heat to bond the FPC boards together, a conductive pressure setting adhesive (PSA) may be used instead. A PSA is an adhesive which forms a bond with an adherend under pressure alone. It is used in pressure setting tapes, labels, note pads, automobile trim, and a wide variety of other products. As the name suggests, the degree of bonding is influenced by the amount of pressure applied, but surface factors such as smoothness, surface energy, contaminants, etc can also affect adhesion. PSAs are usually designed to form and maintain a bond at room temperature. The degree of adhesion and shear holding ability often decrease at low temperatures and high temperatures, respectively. Nevertheless, special PSAs have been developed to function at temperatures above and below room temperature. It is therefore important to use a PSA formulation that is suitable for use at the typical operating temperatures of the electronic circuitry.

As described previously, the FPC boards need to be sealed together in order to form the chamber and prevent the electrolyte from escaping. An electrically conducting or non-conducting adhesive may be used for this purpose. In one embodiment, the ACA or conducting PSA used to provide the electrical connection between the FPC boards could also be used to seal the structure. In this configuration, the fabrication steps of providing the electrical connection and sealing the structure are combined as a single step. In another embodiment, the step of providing the electrical connector may be performed separately from the step of sealing the structure. In this latter embodiment, either the same or different adhesives could be used for each step.

It will be appreciated that, in certain embodiments (as shown in FIG. 6c), a single FPC board 612 may be bent around onto itself to define the chamber, rather than two separate FPC boards 602, 603 being used (although one side of the structure 619 will still need to be sealed to contain the electrolyte). This configuration is referred to as the "origami flex form". An advantage of the origami flex form is that the electrically conductive layer 604 is continuous from one side 613 (i.e. bottom FPC 603) of the structure to the other side 614 (i.e. top FPC 602). This feature negates the need to provide an additional electrical connector between the FPC boards 602, 603 in order to power the electrical components 615. Again, to control charging and discharging of the apparatus, a switch (not shown) is required to make and break the electrical connection, otherwise the charge will simply flow around the circuit between the opposite terminals of the battery 616 (or other power supply) without being stored at the capacitive elements 617, 618.

Integration of the supercapacitor within the FPC structure increases the possibility of distributed local capacitor placement. This feature enables power to be received from local sources without the resistive and inductive losses caused by electrical junctions (e.g. connectors, vias, pogo pins, solder contacts etc). Supercapacitor integration also reduces the number of manufacturing steps in the assembly phase.

As described previously, the multimedia enhancement module needs to be connected to the main board of the electronic device. With rigid and flexible circuit boards, this is usually achieved with a board-to-board (B2B) connector (215 in FIG. 2). To simplify the assembly process further, however, the supercapacitor could be integrated within a rigid-flex circuit board instead. As shown in FIG. 7a (plan view) and FIG. 7b (side view), rigid-flex circuit boards comprise two or more rigid regions 701, 702 which are physically and electrically connected to one another by flexible regions 703. The various electrical components 704 of the circuit are usually connected to the rigid regions 701, 702, with the flexible regions 703 used simply to route power between the rigid regions 701, 702. The presence of the flexible regions 703 allows the rigid-flex board to be bent to fit different shapes and sizes of device casing. FIG. 7c shows a rigid-flex circuit board folded in half with one rigid region 701 positioned above another rigid region 702.

The rigid regions 701, 702 of a rigid-flex circuit board may be used to form the main board and multimedia enhancement module, respectively, thereby obviating the need for a B2B connector. In addition, the supercapacitor may be integrated within a flexible region 703 of the rigid-flex circuit board, thus freeing up space on the rigid regions 701, 702 for other electrical components 704. Furthermore, given that rigid-flex circuit boards can be bent about the flexible region 703 (in some cases through an angle of up to 180°), they are well-suited to flex-to-install and/or dynamic flex applications.

A rigid-flex integrated supercapacitor is shown in FIG. 8a prior to full assembly. The structure comprises first 801 and second 802 rigid regions connected by a flexible (intermediate) region 803, the flexible region 803 comprising first 804 and second 805 sections each comprising an electrically conductive layer 806 and a capacitive element 807. It should be noted, however, that the first 804 and second 805 sections continue from the flexible region 803 of the structure into the rigid regions 801, 802. As illustrated in FIG. 8b, the first 804 and second 805 sections are sealed to define a chamber 808 with the capacitive elements 807 contained therein and facing one another. An electrolyte 810 and separator 811 are also required, as previously described. In order to charge the capacitive elements 807, the positive and negative terminals of the power supply 809 need to be connected to the electrically conductive layers 806 of the first 804 and second 805 sections, respectively. In the configuration shown, the electrically conductive layers 806 of the flexible region 803 extend into the rigid regions 801, 802. In this way, by connecting the positive and negative terminals of the power supply 809 to the electrically conductive layers 806 at one of the rigid regions 801, 802, the capacitive elements 807 can be charged.

A number of different methods may be used to assemble a rigid-flex integrated supercapacitor, four of which will now be described with respect to FIGS. 9a-d. The skilled person will appreciate that the structures and processes described serve merely as examples, and are by no means the only possible options.

In each of the embodiments described below, the first and second sections of the flexible region are sealed together to define a chamber, within which the capacitive elements, the electrolyte, and the separator are contained. This is necessary to prevent the electrolyte from escaping. The electrolyte may be a solid or gel electrolyte, in which case the electrolyte may be added before the first and second sections are sealed at all, or may be a liquid electrolyte, in which case a small hole may be left unsealed for injection of the electrolyte before the structure is sealed completely. As described previously, the separator is configured to prevent direct electrical contact between the capacitive elements.

One method of assembly is shown in FIG. 9a. First 901 and second 902 flexible sections (which may be FPC boards as described with respect to FIG. 2) are provided, each comprising an electrically conductive layer 903 and a capacitive element 904. The capacitive elements 904 may be formed as described with reference to FIG. 2. The electrically conductive layers 903 may be coated on one or both sides by a layer of electrically insulating material 905 (such as polyimide). The electrically insulating material 905 provides electrical isolation and protection for each electrically conductive layer 903. The first 901 and second 902 flexible sections are then bonded to one another. This may be achieved by applying an adhesive 906 (such as an anisotropic conductive adhesive, a pressure setting adhesive or a temperature setting adhesive, as previously described) to a surface of the first 901 and/or second 902 flexible sections, aligning the first flexible section 901 with the second flexible section 902 to form a stack with the capacitive elements 904 facing one another, and applying pressure and/or heat to create the bond. If a non-conducting adhesive is used to bond the first 901 and second 902 flexible sections together, such as a regular lamination adhesive, the electrically conductive layers 903 of the first 901 and second 902 flexible sections may be electrically connected to one another using a vertical interconnect access (VIA) connection (not shown). To form the rigid regions 911, 912 of the structure, a rigid material 907 (such as FR-4 or another glass-reinforced epoxy laminate) is deposited on one or both external surfaces of the stack. It is important, however, that a region 908 of the surface is kept free from rigid material 907 in order to maintain flexibility of the stack at this region. Additional layers of protective material 909 (such as polyimide) may be deposited on top of the rigid material 907 to isolate the rigid material 907 from the external environment. After deposition, the power supply 910 terminals can be connected to the electrically conductive layers 903 at the rigid regions 911, 912 of the structure for charging the capacitive elements 904.

A second method of assembly is shown in FIG. 9b. This time, rather than building the structure up from the flexible sections, one or more pre-fabricated rigid-flex circuit boards are used. This method may be performed using either one rigid-flex circuit board and one FPC board, or two rigid-flex circuit boards. Each of the circuit boards 913, 914 comprises an electrically conductive layer 903 and a capacitive element 904. The capacitive elements 904 may be formed as described with reference to FIG. 2. The circuit boards 913, 914 are then attached using an adhesive 906. As before, the circuit boards 913, 914 must be aligned prior to bonding so that the capacitive elements 904 are facing one another. After bonding, the power supply 910 terminals can be connected to the electrically conductive layers 903 at the rigid regions 911, 912 of the structure for charging the capacitive elements 904.

In another embodiment (shown in FIG. 9c), a flexible section of material 916 may be attached between the rigid regions 911, 912 of a pre-fabricated rigid-flex circuit board 917 to provide the second capacitive element 904, rather than combining first and second pre-fabricated circuit boards 913, 914. The flexible region 915 of the rigid-flex circuit board 917 and the attached flexible section 916 each comprise an electrically conductive layer 903 and a capacitive element 904. The capacitive elements 904 may be formed as described with reference to FIG. 2. In this embodiment, however, although the rigid regions 911, 912 of the circuit board 917 each comprise first 903 and second 918 electrically conductive layers, only the first electrically conductive layer 903 is common to both rigid regions 911, 912 and the flexible region 915. In order to provide power to the capacitive element 904 of the attached flexible section 916, therefore, electrical contact must be established between the second electrically conductive layer 918 of the circuit board 917 and the electrically conductive layer 903 of the attached flexible section 916. In practice, this may be achieved by including a metallic interconnector 919 in the rigid regions 911, 912 of the circuit board as illustrated. After electrical contact has been established, the power supply 910 terminals can be connected to the electrically conductive layers 903, 918 at the rigid regions 911, 912 of the structure for charging the capacitive elements 904.

Figure 9D:
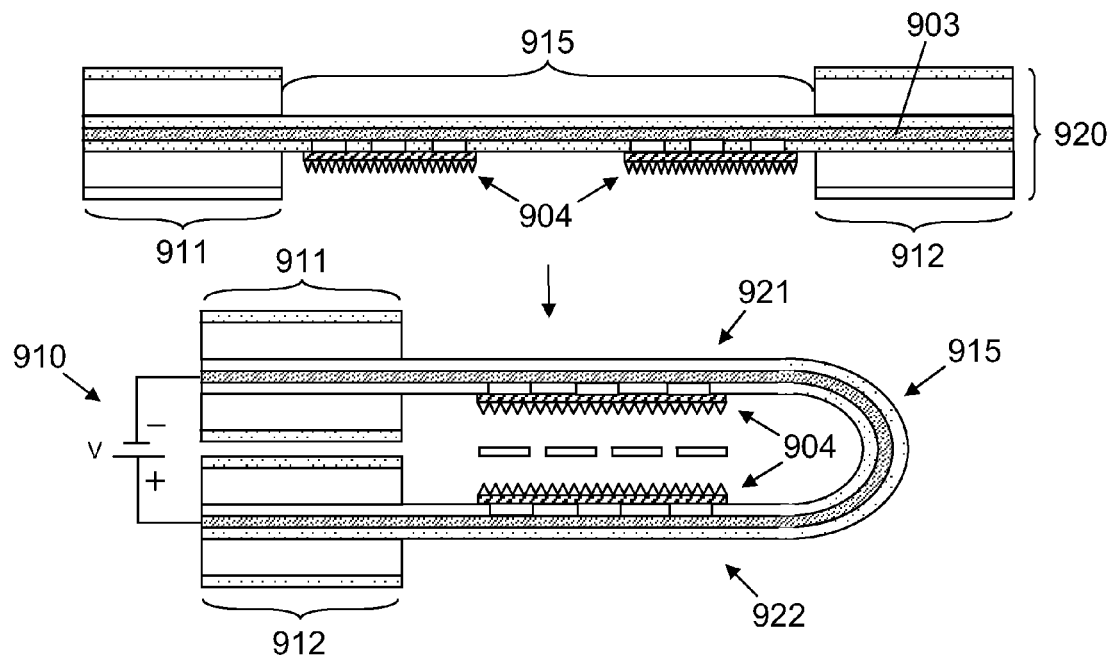
FIG. 9d illustrates schematically a fourth method of assembling the rigid-flex integrated supercapacitor of FIG. 8.

A final embodiment is shown in FIG. 9d. In this embodiment, a single pre-fabricated rigid-flex circuit board 920 is required. The circuit board 920 comprises two rigid regions 911, 912 electrically connected by a flexible region 915, the rigid regions 911, 912 and flexible region 915 sharing a common electrically conductive layer 903. Whilst the rigid-flex circuit board 920 may comprise more than one common electrically conductive layer 903, only one is required. Rather than attaching another section of material 916 or circuit board 914 to the existing board 920 to provide the second capacitive element 904 and electrically conductive layer 903, both capacitive elements 904 are added to one side of the flexible region 915, and the circuit board 920 is bent about the flexible region 915 such that the capacitive elements 904 are facing one another. In this embodiment, the different ends 921, 922 of the flexible region 915 constitute the first and second sections 804, 805 of the supercapacitor structure. To charge the supercapacitor, the positive and negative terminals of the power supply 910 may be connected to the electrically conductive layer 903 of the first 911 and second 912 rigid regions, respectively.

In each of the rigid-flex structures shown in FIGS. 9a-9d, at least one electrically conductive layer extends through the entire structure from one end to the other (i.e. forming part of the flexible and rigid regions). An exception to this is illustrated in FIG. 9c, where a separate electrically conductive layer is attached between the rigid regions of the structure. This fabrication process (termed the "E-flex" process by Ibiden Inc) could be applied to each of the structures in FIG. 9a-9d, wherein some or all of the electrically conductive layers (possibly coated by an insulator) are attached between the rigid regions using an adhesive (conducting or non-conducting) and do not extend through the rigid regions.

Rather than using a rigid material to stiffen the rigid regions of the circuit board, the number and/or thickness of the electrically conductive and electrically insulating layers may be increased in these regions to provide greater rigidity. Furthermore, the structure may also incorporate one or more of the following: a cover layer, an electromagnetic shield layer, a thermal protection layer, and an organic surface protection layer, which may also increase the rigidity of the structure. Any of the above-mentioned layers may be incorporated within the rigid or flexible regions of the circuit board.

The structure may also comprise an electrical connector (as described with respect to FIGS. 5 and 6) between the electrically conductive layers of the first and second sections to enable a flow of electrical charge from the capacitive elements to the electrical components when the apparatus discharges. The electrical components themselves may be physically and electrically connected (e.g. by surface mounting) to the rigid and/or flexible regions of the circuit board. The electrical connector may comprise an electrically conductive adhesive (such as an anisotropic conductive adhesive or a conductive pressure setting adhesive) or may comprise a metallic interconnector (such as vertical interconnect access, VIA, connector). Where an electrically conductive adhesive is used to provide the electrical connection, the electrically conductive adhesive may also be used to seal the first and second sections together to contain the electrolyte within the chamber. Combining the sealing and connection steps simplifies the fabrication process. Furthermore, the structure may also comprise a switching mechanism (not shown) to make and break the electrical connection between the first and second sections (as described with respect to FIG. 5).

One advantage of the embodiment shown in FIG. 9d is that the electrically conductive layer extends from one capacitive element to the other, thereby negating the need to provide an additional electrical connector in order to discharge the supercapacitor and route power to the electrical components. A switching mechanism is required to make and break the electrical connection, however, otherwise the charge will simply flow around the circuit between the terminals of the power supply without being stored at the capacitive elements.

In each of the embodiments described above, the presence of the supercapacitor (chamber) within the flexible region may increase the rigidity of the flexible region. In some situations this may be beneficial. For example, in flexible circuit boards, stiffeners are sometimes added to minimise shock and vibration of the circuit board during assembly and/or operation of the device. These vibrations can damage the electrically conductive traces and is therefore an important consideration.

As previously mentioned, the working voltage of a supercapacitor is limited by the breakdown voltage of the electrolyte. There are two types of electrolyte typically used in supercapacitors—aqueous electrolytes and organic electrolytes. The maximum voltage for supercapacitor cells that use aqueous electrolytes is the breakdown voltage of water, ~1.1V, so these supercapacitors typically have a maximum voltage of 0.9V per cell. Organic electrolyte supercapacitors are rated in the range of 2.3V-2.7V per cell, depending on the electrolyte used and the maximum rated operating temperature. In order to increase the working voltage of a supercapacitor, several supercapacitor cells may be connected in series.

Figure 10A:
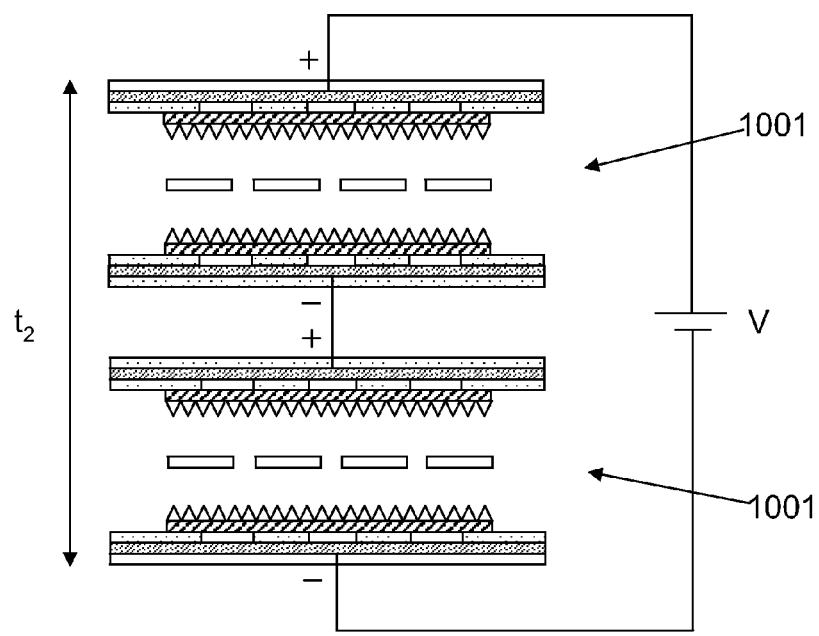
FIG. 10a illustrates schematically two flexible printed circuit structures connected in series.

FIG. 10a shows two supercapacitors 1001 connected in series. The supercapacitors may be integrated within an FPC or rigid-flex structure. In this configuration, the total capacitance and maximum working voltage are given by $1/C_{total}=1/C_1+1/C_2$ and $V_{max}=V_1+V_2$, respectively. Therefore, although the working voltage is increased relative to a single supercapacitor 1001, the capacitance of the stack is reduced. The capacitance may be increased by connecting the supercapacitors 1001 in parallel, as shown in FIG. 10b. In this configuration, the total capacitance and maximum working voltage are given by $C_{total}=C_1+C_2$ and $V_{max}=V_1=V_2$, respectively. Therefore, although the capacitance of the stack is increased, the working voltage remains the same as that of a single supercapacitor 1001. A disadvantage of stacking the supercapacitors 1001, however, is the increase in thickness, $t_2$, of the structure which reduces its flexibility.

FIGS. 10c and 10d show how two circuit boards may combined in origami flex form to create a stack of integrated supercapacitors. The flexible circuit boards may be flexible (FPC) circuit boards as illustrated in FIG. 6c, or rigid-flex circuit boards as illustrated in FIG. 9d. In the latter case, the rigid-flex circuit boards would be bent about their flexible regions.

In FIG. 10c, first 1002 and second 1003 circuit boards, each comprising at least two capacitive elements 1001, are positioned one on top of the other such that the capacitive elements 1001 on the first circuit board 1002 are facing the capacitive elements 1001 on the second circuit board 1003. The structure is then bent around onto itself to form a C-shaped stack of supercapacitors. In this configuration, the capacitive elements 1001 are formed on the first 1004, 1006 and second 1005, 1007 ends of each circuit board 1002, 1003, thereby providing a two-capacitor stack. As described previously, the first 1002 and second 1003 circuit boards would need to be sealed together to hold the capacitive elements 1001 in position, and further sealed to form chambers around each pair of capacitive elements 1001 within which the separators and electrolyte (not shown) are contained. The sealing steps may be combined as a single step, or may be performed as separate steps. The terminals of the power supply 1008 are then connected to the first 1002 and second 1003 circuit boards to allow charging of the capacitive elements 1001. In this configuration, an electrical connector with switch (not shown) is required to connect the first 1002 and second 1003 circuit boards in order to discharge the capacitive elements 1001 and power the electrical components (not shown). An electrically conductive adhesive (e.g. anisotropic conductive adhesive, pressure sensitive adhesive or pressure sensitive adhesive) may be used to seal the first 1002 and second 1003 circuit boards together and form the electrical connector. Furthermore, the electrical components may be electrically connected (e.g. surface mounted) to either or both of the circuit boards 1002, 1003.

In FIG. 10d, the first 1002 and second 1003 circuit boards are configured such that the first end 1005 of the second circuit board 1003 is positioned between the first 1004 and second 1006 ends of the first circuit board 1002 to form an S-shaped stack of supercapacitors. In this configuration, three capacitive elements 1001 are formed on each circuit board 1002, 1003 to provide a three-capacitor stack. Again, the terminals of the power supply 1008 are connected to the first 1002 and second 1003 circuit boards to allow charging of the capacitive elements 1001.

To test the behaviour of the supercapacitors, cyclic voltammetry experiments were performed using a 5 cm²-area supercapacitor with a 1M solution of tetraethylammonium tetrafluoroborate in acetonitrile as the electrolyte. Cyclic voltammetry is a type of potentiodynamic electrochemical measurement which involves increasing the electrode potential linearly with time whilst measuring the current. This ramping is known as the experiment scan rate (V/s). In this case, a scan rate of 50 mV/s was used. Once the voltage reaches a set potential, the potential ramp is inverted. This inversion is usually performed a number of times during a single experiment. The current is then plotted against the applied voltage to give the cyclic voltammogram trace.

This experiment produced a rectangular trace (not shown) indicating good capacitor behaviour. Furthermore, during the experiment the applied voltage was increased to 2.7V without degradation of the supercapacitor performance.

Following this, the effect of varying the number of separator layers in the supercapacitor was studied. Again, these experiments were performed using 5 cm²-area supercapacitors with a 1M solution of tetraethylammonium tetrafluoroborate in acetonitrile as the electrolyte. It was found that an increase in the number of separator layers from 1 to 2 caused an increase in capacitance and a decrease in ESR. The same trend was observed when the number of separator layers was increased from 2 to 3. This may be attributed to a greater number of pores available to accommodate the ionic species in the electrolyte, which may allow more ions to interact with the high surface material. When the number of separator layers was increased beyond 3, however, there was no further change in capacitance.

Charge-discharge (V) curves (not shown) cycled at ±1 mA (+1 mA for charging the cell and −1 mA for discharging the cell, each cycle lasting 20 secs) revealed capacitances of between 250-649 mF with ESRs of between 5.35-1.8Ω. The capacitance was deduced from the slope of the discharging curve where C=I/(dV/dt), C is the capacitance of the cell in farads, I is the discharge current in amperes, and dV/dt is the slope in volts per second. The direct current ESR was calculated using ESR=dV/dI, where dV is the voltage drop at the beginning of the discharge in volts, and dI is the current change in amperes.

The effect of varying the high surface material in the supercapacitor was also studied. Three formulations of high surface material were tested: 97% activated carbon and 3% PTFE (binder), (ii) 87% activate carbon, 10% carbon nanotubes and 3% PTFE, and (iii) 77% activated carbon, 20% carbon nanotubes and 3% PTFE. Again, these experiments were performed using 5 cm$^2$-area supercapacitors with a 1M solution of tetraethylammonium tetrafluoroborate in acetonitrile as the electrolyte.

Cyclic voltammetry experiments produced rectangular traces (not shown) for each sample, indicating good capacitor behaviour. Furthermore, charge-discharge (V) curves (not shown) cycled at ±1 mA revealed respective capacitances of 476, 500 and 649 mF with respective ESRs of 2.3, 1.8 and 1.8Ω. The increase in capacitance and decrease in ESR with nanotube content may be attributed to the high surface area and high electrical conductivity of the carbon nanotubes.

Figure 11:
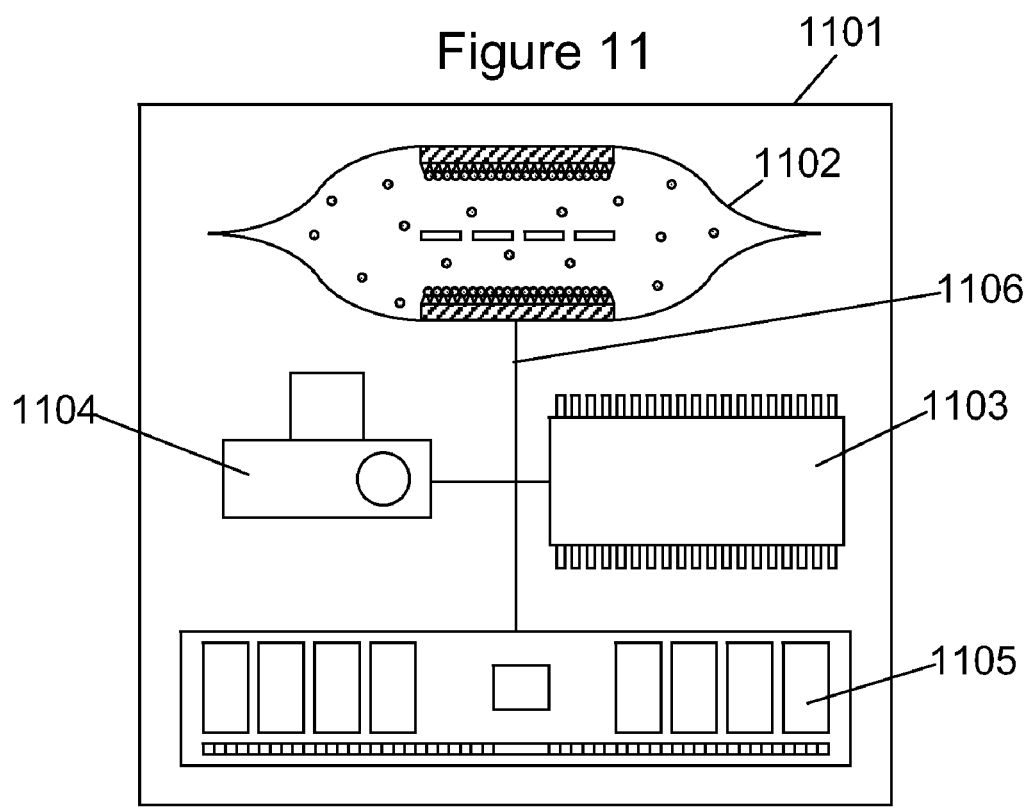
FIG. 11 illustrates schematically a device comprising the apparatus described herein.

FIG. 11 illustrates schematically an electronic device 1101 comprising an FPC or rigid-flex integrated supercapacitor 1102. The device also comprises a processor 1103, a multimedia apparatus 1104, and a storage medium 1105, which may be electrically connected to one another by a data bus 1106. The device 1101 may be a portable telecommunications device, whilst the multimedia apparatus 1104, may be a built-in camera, loudspeaker or transmitter of electromagnetic signals.

The FPC or rigid-flex structure 1102 (within which the supercapacitor is integrated) forms a multimedia enhancement module for the multimedia apparatus 1104. The supercapacitor itself is used to store electrical charge for powering the various components of the multimedia enhancement module which are physically (and electrically) connected to the FPC or rigid-flex structure. The multimedia enhancement module may be a camera flash module, a loudspeaker driver module, or a power amplifier module for electromagnetic signal transmission.

The processor 1103 is configured for general operation of the device 1101 by providing signalling to, and receiving signalling from, the other device components to manage their operation. In particular, the processor 1103 is configured to provide signalling to control the charging and discharging of the supercapacitor 1102. Typically, the supercapacitor 1102 will discharge whenever the multimedia enhancement module requires a short current burst. Where the multimedia apparatus 1104 is a camera, for example, a short burst of current will be required whenever the user of the device 1101 wishes to take a photograph using the camera flash. In this scenario, the processor 1103 provides signalling to instruct the supercapacitor 1102 to discharge and provide the flash with the required current. After the supercapacitor 1102 has discharged, the processor 1103 instructs the supercapacitor 1102 to recharge using a connected battery (or other power supply). The use of a supercapacitor 1102 therefore removes the instantaneous energy demands that would normally be placed on the battery. The processor 1103 may provide signalling to operate a switch, operation of the switch configured to break and make the electrical connection between the capacitive elements to cause charging and discharging of the supercapacitor 1102, respectively.

The storage medium 1105 is configured to store computer code required to operate the apparatus, as described with reference to FIG. 12. The storage medium 1105 may also be configured to store device settings. For example, the storage medium 1105 may be used to store specific current/voltage setting for the various electrical components (e.g. the components of the multimedia enhancement module or the components of the multimedia apparatus 1104). In particular, the storage medium 1105 may be used to store the voltage setting of the supercapacitor 1102. The processor 1103 may access the storage medium 1105 to retrieve the desired information before instructing the supercapacitor 1102 to recharge using the battery. The storage medium 1105 may be a temporary storage medium such as a volatile random access memory. On the other hand, the storage medium 1105 may be a permanent storage medium such as a hard disk drive, a flash memory, or a non-volatile random access memory.

Figure 12:
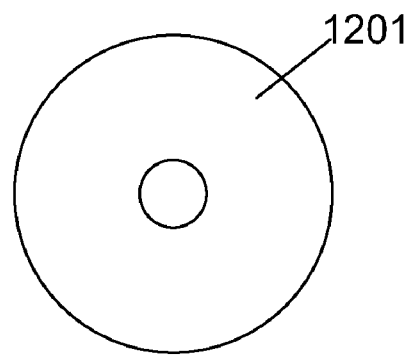
FIG. 12 illustrates schematically a computer readable media providing a program.

FIG. 12 illustrates schematically a computer/processor readable medium 1201 providing a computer program according to one embodiment. In this example, the computer/processor readable medium 1201 is a disc such as a digital versatile disc (DVD) or a compact disc (CD). In other embodiments, the computer/processor readable medium 1201 may be any medium that has been programmed in such a way as to carry out an inventive function. The computer/processor readable medium 1201 may be a removable memory device such as a memory stick or memory card (SD, mini SD or micro SD).

The computer program may comprising computer code configured to control the storage of electrical charge using an apparatus, the apparatus comprising a rigid-flex circuit board and an electrolyte, the rigid-flex circuit board comprising first and second rigid regions physically and electrically connected to one another by a flexible region, the flexible region comprising first and second sections each comprising an electrically conductive layer and a capacitive element, wherein the apparatus is configured such that a chamber is defined between the first and second sections with the capacitive elements contained therein and facing one another, the chamber comprising the electrolyte, and wherein the apparatus is configured to store electrical charge when a potential difference is applied between the capacitive elements, the computer program comprising computer code configured to apply a potential difference between the capacitive elements.

Figure 13:
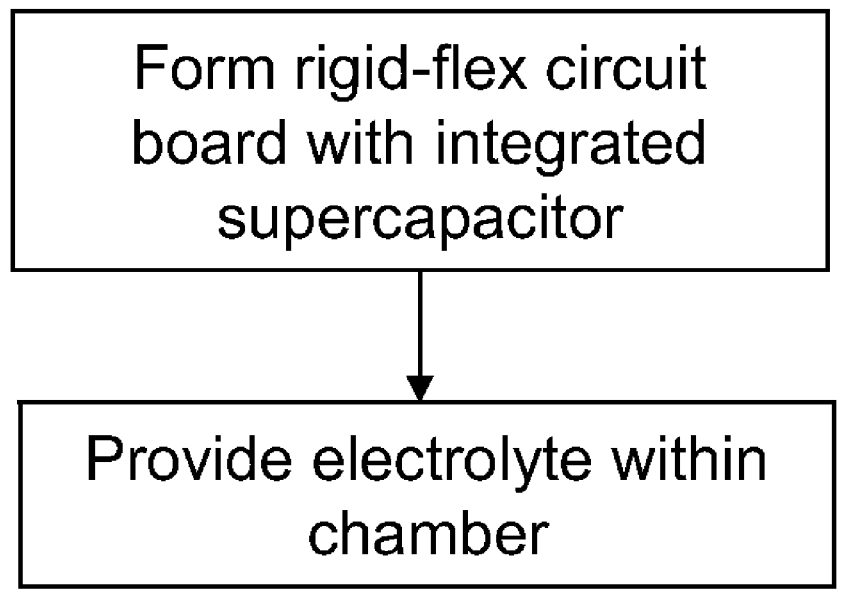
FIG. 13 illustrates schematically a method of assembling a rigid-flex integrated supercapacitor.
Figure 14:
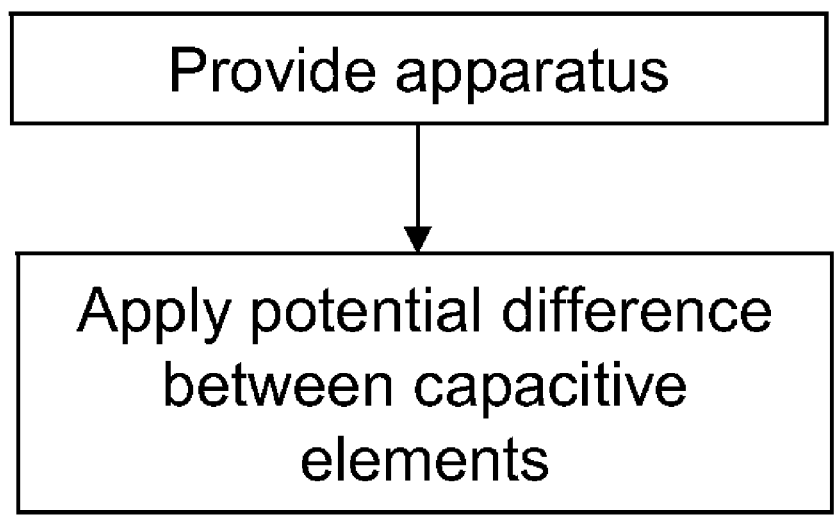
FIG. 14 illustrates schematically a method of storing electrical charge using a rigid-flex integrated supercapacitor.

The key steps of the method used to assemble a rigid-flex integrated supercapacitor are illustrated schematically in FIG. 13. Supercapacitors produced in this way are capable of providing a capacitance of ~40 mF/cm$^2$. The key steps of the method used to store electrical charge using a rigid-flex integrated supercapacitor are illustrated schematically in FIG. 14.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An apparatus comprising a rigid-flex circuit board and an electrolyte,
    the rigid-flex circuit board comprising first and second rigid regions physically and electrically connected to one another by a flexible region, the flexible region comprising first and second sections each comprising an electrically conductive layer and a capacitive element,
    wherein the apparatus is configured such that a chamber is defined between the first and second sections with the respective capacitive elements contained therein and facing one another, the chamber comprising the electrolyte, and
    wherein the apparatus is configured to store electrical charge when a potential difference is applied between the respective capacitive elements.

2. The apparatus of claim 1, wherein each of the rigid regions comprises a layered structure, the first and second sections forming part of the layered structure of the rigid regions.

3. The apparatus of claim 1, wherein each of the rigid regions comprises a layered structure, and wherein the first section forms part of the layered structure of the rigid regions but the second section does not.

4. The apparatus of claim 1, wherein the apparatus comprises an electrical connector between the electrically conductive layers of the first and Second sections, the electrical connector configured to enable a flow of electrical charge from the capacitive elements to provide power to one or more electrical components when the apparatus discharges.

5. The apparatus of claim 4, wherein the electrical connector comprises an electrically conductive adhesive.

6. The apparatus of claim 5, wherein the electrically conductive adhesive is further configured to seal the first and second sections together to contain the electrolyte within the chamber.

7. The apparatus of claim 4, wherein the electrical connector comprises a metallic interconnector.

8. The apparatus of claim 4, the apparatus comprising a switch configured to connect and disconnect the electrical connector, wherein disconnection of the electrical connector is configured to allow the apparatus to be charged, and connection of the electrical connector is configured to allow the apparatus to be discharged.

9. The apparatus of claim 1, wherein the flexible region is configured to allow the apparatus to be bent through an angle of less than or equal to 180°.

10. The apparatus of claim 1, wherein the flexible region is configured to allow the apparatus to be bent with a bending radius of greater than or equal to 1.3 mm.

11. The apparatus of claim 1, wherein the flexible region is sufficiently flexible to render the apparatus suitable for use in flex-to-install applications.

12. The apparatus of claim 1, wherein the flexible region comprises a single section, the single section comprising an electrically conductive layer and first and second capacitive elements, the first and second sections being different ends of the single section which has been bent around onto itself to define the chamber.

13. The apparatus of claim 1, wherein the apparatus forms part of a portable electronic device or part of a module for a portable electronic device.

14. A method of assembly, the method comprising:
    forming a rigid-flex circuit board, the rigid-flex circuit board comprising first and second rigid regions physically and electrically connected to one another by a flexible region, the flexible region comprising first and second sections each comprising an electrically conductive layer and a capacitive element, the first and second sections configured to define a chamber between the first and second sections with the respective capacitive elements contained therein and facing one another; and providing an electrolyte within the chamber to produce an apparatus, the apparatus comprising the rigid-flex circuit board and the electrolyte, wherein the apparatus is configured to store electrical charge when a potential difference is applied between the respective capacitive elements.

15. The method of claim 14, wherein forming the rigid-flex circuit board comprises:

providing first and second flexible sections, the first and second flexible sections each comprising an electrically conductive layer and a capacitive element;

applying an adhesive to a surface of the first and/or second flexible sections;

aligning the first flexible section with the second flexible section to form a stack, the first and second flexible sections aligned such that the capacitive elements are facing one another;

applying pressure and/or heat to bond the first flexible section to the second flexible section using the adhesive; and depositing a rigid material on a surface of the stack leaving a region of the surface free from rigid material to maintain flexibility of the stack at this region.

16. The method of claim 14, wherein forming the rigid-flex circuit board comprises:

providing first and second circuit boards, the first circuit board comprising first and second rigid regions physically and electrically connected to one another by a flexible region, the second circuit board comprising a flexible region, the flexible region of each circuit board comprising an electrically conductive layer and a capacitive element;

applying an adhesive to a surface of the first and/or second circuit board;

aligning the first circuit board with the second circuit board to form a stack, the first and second circuit boards aligned such that the capacitive elements are facing one another; and applying pressure and/or heat to bond the first circuit board to the second circuit board using the adhesive.

17. The method of claim 14, wherein forming the rigid-flex circuit board comprises:

providing a rigid-flex circuit board, the rigid-flex circuit board comprising first and second rigid regions physically and electrically connected to one another by a flexible region, the flexible region comprising an electrically conductive layer and a capacitive element;

providing a flexible section, the flexible section comprising an electrically conductive layer and a capacitive element;

applying an adhesive to a surface of the flexible region and/or flexible section;

aligning the flexible section with the flexible region to form a stack, the flexible section and the flexible region aligned such that the capacitive elements are facing one another; and applying pressure and/or heat to bond the flexible section to the flexible region using the adhesive.

18. The method of claim 14, wherein forming the rigid-flex circuit board comprises:

providing a rigid-flex circuit board, the rigid-flex circuit board comprising first and second rigid regions physically and electrically connected to one another by a flexible region, the flexible region comprising an electrically conductive layer and first and second capacitive elements;

applying an adhesive to a surface of the flexible region;

bending the rigid-flex circuit board about the flexible region such that the flexible region is bent around onto itself to form a stack, the different ends of the flexible region constituting the first and second sections;

aligning the ends of the flexible region such that the first and second capacitive elements are facing one another; and applying pressure and/or heat to bond the ends of the flexible region together using the adhesive.

19. A method of storing electrical charge, the method comprising:

providing an apparatus, the apparatus comprising a rigid-flex circuit board and an electrolyte, the rigid-flex circuit board comprising first and second rigid regions physically and electrically connected to one another by a flexible region, the flexible region comprising first and second sections each comprising an electrically conductive layer and a capacitive element, wherein the apparatus is configured such that a chamber is defined between the first and second sections with the respective capacitive elements contained therein and facing one another, the chamber comprising the electrolyte, and wherein the apparatus is configured to store electrical charge when a potential difference is applied between the respective capacitive elements; and applying a potential difference between the respective capacitive elements.

* * * * *